(12) United States Patent
Kurita et al.

(10) Patent No.: US 6,926,187 B2
(45) Date of Patent: Aug. 9, 2005

(54) ULTRASONIC MANUFACTURING APPARATUS

(75) Inventors: Hideyuki Kurita, Yokohama (JP);
Masanao Watanabe, Kanuma (JP);
Masayuki Nakamura, Kanuma (JP);
Mitsuhiro Fukuda, Kanuma (JP);
Hiroyuki Usui, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 148 days.

(21) Appl. No.: 10/423,977

(22) Filed: Apr. 28, 2003

(65) Prior Publication Data

US 2003/0234085 A1 Dec. 25, 2003

Related U.S. Application Data

(62) Division of application No. 09/642,638, filed on Aug. 22, 2000, now Pat. No. 6,583,364.

(30) Foreign Application Priority Data

| Aug. 26, 1999 | (JP) | ............................................ | 11-239358 |
| Sep. 1, 1999 | (JP) | ............................................ | 11-246954 |
| Sep. 1, 1999 | (JP) | ............................................ | 11-246963 |

(51) Int. Cl.$^7$ ................................................. B23K 1/06
(52) U.S. Cl. ..................................... 228/1.1; 156/580.2
(58) Field of Search .............................. 228/1.1, 110.1; 156/73.1, 73.3, 73.6, 580.1, 580.2

(56) References Cited

U.S. PATENT DOCUMENTS

| 4,099,038 A | | 7/1978 | Purdy |
| 4,499,845 A | * | 2/1985 | Pope .................... 116/137 A |
| 4,604,160 A | | 8/1986 | Murakami et al. |
| 4,767,492 A | * | 8/1988 | Fukusima et al. ....... 156/580.2 |
| 5,014,162 A | | 5/1991 | Clark et al. |
| 5,118,386 A | | 6/1992 | Kataoka et al. |
| 5,478,972 A | | 12/1995 | Mizutani et al. |
| 5,600,103 A | | 2/1997 | Odaira et al. |
| 5,672,400 A | | 9/1997 | Hansen et al. |
| 5,688,584 A | | 11/1997 | Casson et al. |
| 5,736,681 A | | 4/1998 | Yamamoto et al. |
| 5,737,833 A | | 4/1998 | Motomura et al. |
| 5,820,011 A | * | 10/1998 | Ito et al. ...................... 228/1.1 |
| 5,830,300 A | * | 11/1998 | Suzuki et al. ............... 156/73.1 |
| 5,886,409 A | | 3/1999 | Ishino et al. |
| 5,915,753 A | | 6/1999 | Motomura et al. |
| 5,962,813 A | * | 10/1999 | Shirako et al. ........... 174/88 R |
| 5,985,065 A | * | 11/1999 | Kling ........................ 156/73.3 |
| 6,027,009 A | * | 2/2000 | Shinchi .................... 228/111.5 |
| 6,184,471 B1 | * | 2/2001 | Asakura et al. ................ 174/78 |
| 6,252,176 B1 | | 6/2001 | Kuramochi et al. |
| 6,583,364 B1 | * | 6/2003 | Kurita et al. ................ 174/254 |
| 2003/0234085 A1 | * | 12/2003 | Kurita et al. ............. 156/580.2 |

FOREIGN PATENT DOCUMENTS

| JP | 37-2441 | | 5/1962 |
| JP | 59-187499 | | 10/1984 |
| JP | 360201928 A | * | 10/1985 |
| JP | 62-120964 | | 6/1987 |
| JP | 362282914 A | * | 12/1987 |
| JP | 401087330 A | * | 3/1989 |

(Continued)

*Primary Examiner*—Kiley S. Stoner
(74) *Attorney, Agent, or Firm*—Oliff & Berridge, PLC

(57) ABSTRACT

The present invention pertains to a multilayer flexible wiring board.

The multilayer flexible wiring board including first and second patterned wiring layers, a resin film interposed between a surface of the first wiring layer and a surface of the second wiring layer, and a bump connected to the surface of the second wiring layer, wherein the resin film is adapted to form an opening when the bump to force into the resin film and an ultrasonic wave is applied to the bump and the bump is left in the opening to electrically connect the top of the bump to the first wiring layer.

5 Claims, 23 Drawing Sheets

FOREIGN PATENT DOCUMENTS

| | | |
|---|---|---|
| JP | 5-21961 | 1/1993 |
| JP | 6-140739 | 5/1994 |
| JP | 6-188560 | 7/1994 |
| JP | 6-216258 | 8/1994 |
| JP | 6-283866 | 10/1994 |
| JP | 6-326438 | 11/1994 |
| JP | 7-79075 | 3/1995 |
| JP | 407105946 A * | 4/1995 |
| JP | 8-125344 | 5/1996 |
| JP | 8-264939 | 8/1996 |
| JP | 10-303355 | 11/1998 |
| JP | 11-112147 | 4/1999 |

* cited by examiner

Fig. 4k
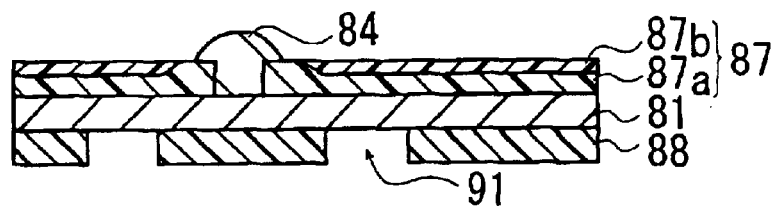
Fig. 4ℓ
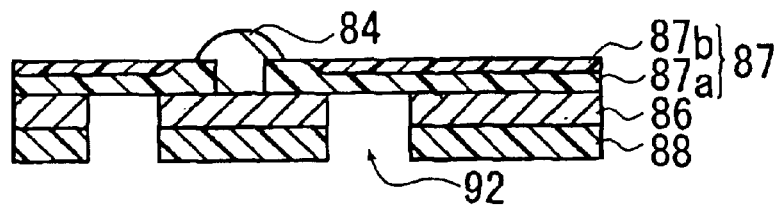
Fig. 4m
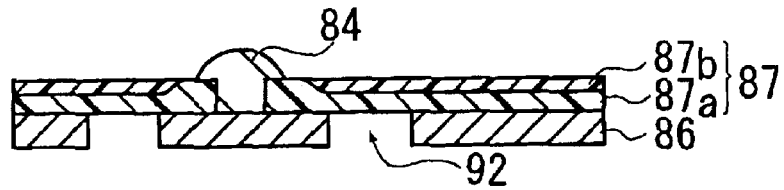
Fig. 4n
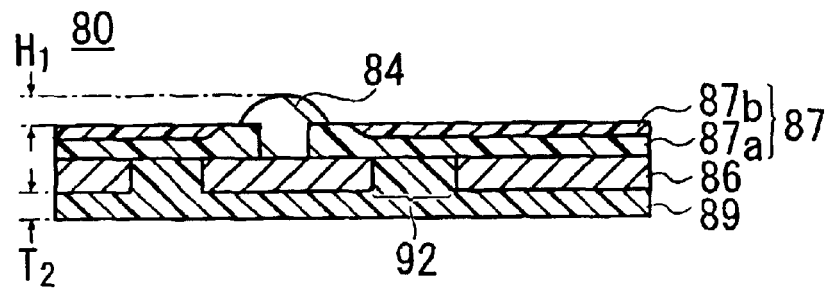

Fig.21ℓ 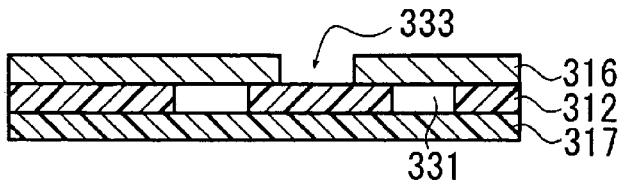

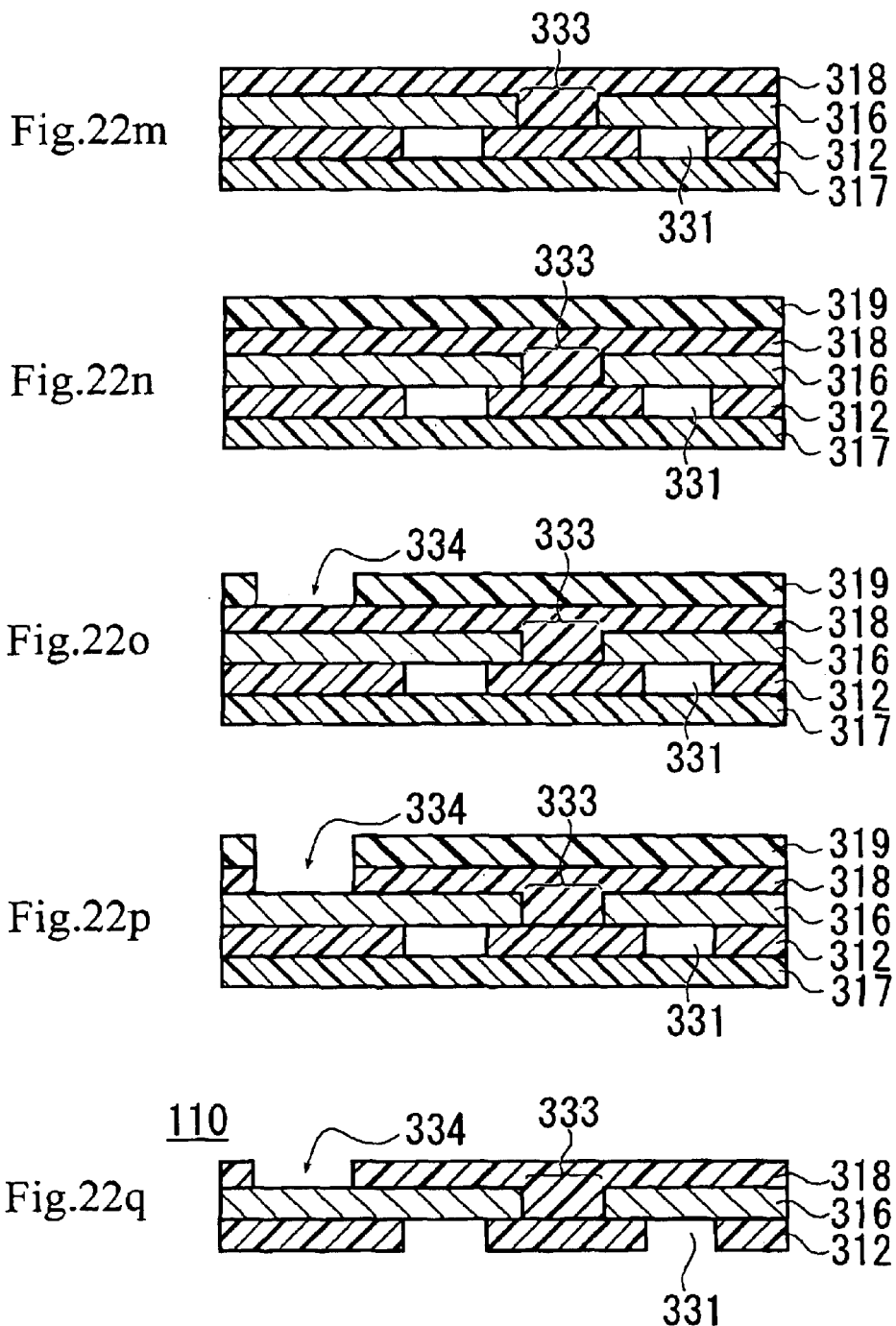

ULTRASONIC MANUFACTURING APPARATUS

This is Division of application Ser. No. 09/642,638 filed Aug. 22, 2000 now U.S. Pat. No. 6,583,364.

BACKGROUND OF THE INVENTION

1. Field of Invention

The present invention relates to the field of flexible printed wiring boards, particularly to the field of flexible printed wiring boards of multilayer structure.

2. Description of Related Art

Recently, flexible wiring boards of multilayer structure are used in many electronic circuits.

As an example, a process for manufacturing a multilayer flexible printed wiring board is explained. Referring to FIG. 20(a), the reference number 311 represents a copper foil having a thickness of dozens of micrometers.

A polyimide varnish is first applied on this copper foil 311 to form a base film 312 consisting of a polyimide film (FIG. 20(b)). Then, a resist layer 313 is formed on base film 312 (FIG. 20(c)), and resist layer 313 is patterned via photographic processes. The reference number 331 in FIG. 20(d) represents an opening in resist layer 313, and base film 312 is exposed at the bottom of this opening 331.

Then, the part of base film 312 exposed at the bottom of opening 331 is etched off (FIG. 20(e)). Then, resist layer 313 is removed to give a patterned base film 312 (FIG. 20(f)).

In FIG. 21(g), base film 312 is inverted with copper foil 311 upward. A masking film 317 is applied on base film 312 (FIG. 21(h)), and a resist layer 315 is formed on copper foil 311 (FIG. 21(i)).

Then, resist layer 315 is patterned via exposure and development processes. The reference number 332 in FIG. 21(j)) represents an opening formed by patterning in resist layer 315. Copper foil 311 is exposed at the bottom of this opening 332.

Then, copper foil 311 at the bottom of opening 332 is etched to pattern copper foil 311 into a first wiring layer 316 (FIG. 21(k)). The reference number 333 represents the part from which copper foil 311 has been removed and an opening segmenting first wiring layer 316. The top of base film 312 is exposed at the bottom of opening 333. Resist layer 315 is removed (FIG. 21(l)) and a polyimide varnish is applied on the top of first wiring layer 316 so that the polyimide varnish flows into opening 333 in first wiring layer 316 to form a cover film 318 consisting of a polyimide film having a flat surface. A resist layer 319 is formed on the top of cover film 318 (FIG. 22(n)) and resist layer 319 is patterned via exposure and development processes.

The reference number 334 in FIG. 22(o) represents an opening formed by patterning in resist layer 319. Cover film 318 is exposed at the bottom of this opening 334.

Then, the part of cover film 318 located at the bottom of opening 334 is etched off with a metallic etching solution to pattern cover film 318 so that first wiring layer 316 is exposed at the bottom of the opening 334. The etching solution used here is selected not to etch first wiring layer 316.

Finally, resist layer 319 is removed and followed by heat treatment to imidate base film 312 and cover film 318, whereby a first single-wiring layer board piece 310 is obtained (FIG. 22(q)).

Thus obtained first single-wiring layer board piece 310 comprises first wiring layer 316, patterned base film 312 provided on one side of first wiring layer 316 and patterned cover film 318 provided on the opposite side of first wiring layer 316. Opening 333 in first wiring layer 316 is filled with cover film 318.

The reference number 380 in FIG. 23(a) represents a second single-wiring layer board piece to be laminated to first single-wiring layer board piece 310. This second single-wiring layer board piece 380 comprises a base film 381 consisting of a polyimide film, a second wiring layer 386 provided on said base film 381 and a cover film 382 provided on said second wiring layer 386.

Said second wiring layer 386 consists of a patterned copper foil and said cover film 382 consists of a polyimide film.

Second single-wiring layer board piece 380 has a plurality of bumps 384 connected to second wiring layer 386 at the bottoms and projecting from cover film 382 at the tops.

First single-wiring layer board piece 310 is opposed to the plane of second single-wiring layer board piece 380 from which the tops of bumps 384 project in parallel thereto, and bumps 384 are aligned with openings 331 in base film 312 to bring bumps 384 into contact with the surface of first wiring layer 316, whereby first and second wiring layers 316 and 386 are connected via bumps 384.

If either one of two cover films 312, 382 includes of a thermoplastic resin having the property of developing adhesiveness upon heating, first and second single-wiring layer board pieces 310, 380 can be bonded together by heating them while bumps 384 are in contact with the surface of first wiring layer 316. The reference number 351 in FIG. 23(b) represents a multilayer wiring board comprising first and second single-wiring layer board pieces 310, 380 bonded together.

The process for forming an opening by patterning a polyimide film by etching as described above provides finer openings than laser etching or drilling so that it is widely used in the manufacture of high-density multilayer flexible wiring boards in which openings should be provided with narrow gaps.

However, the etching process using an alkali solution as described above involves complex control of the temperature or state of the solution. Particularly when etching conditions are insufficiently controlled, variation may occur in the size of openings formed in polyimide.

Moreover, the use of a resist layer consisting of a photosensitive film for forming an opening adds production costs.

An object of the present invention is to simplify the complex conventional process for manufacturing a multilayer wiring board as described above and to provide a single-layer flexible wiring board suitable for preparing a multilayer flexible wiring board, the resulting multilayer flexible wiring board, a process for manufacturing a multilayer flexible wiring board and an ultrasonic manufacturing apparatus suitable for use in the manufacturing process.

SUMMARY OF THE INVENTION

In order to attain the above object, the present invention provides a process for manufacturing a multilayer flexible wiring board by using a first single-wiring layer board piece having a first patterned wiring layer and a first resin film in close contact with said first wiring layer, and a second single-wiring layer board piece having a second patterned wiring layer and a plurality of bumps connected to said second wiring layer at the bottoms to laminate said first and second single-wiring layer board pieces into a multilayer flexible wiring board, said process comprising bringing the top of each of said bumps into contact with said first resin film, applying ultrasonic wave to at least one of said first and second single-wiring layer board pieces to force into said first resin film in contact with said each bump to form an opening, and bringing said each bump into contact with said first wiring layer to electrically connect said first and second wiring layers via said each bump.

According to this aspect of the present invention, said each bump may be ultrasonically vibrated in the direction along the surface of said first resin film.

According to the present invention, said application of ultrasonic wave may be continued after the top of said each bump comes into contact with said first wiring layer to ultrasonically bond said each bump to said first wiring layer.

According to the present invention, said first and second wiring layers and said bumps may consist of a metal material based on copper, and either one or both of the surface of at least the top of said each bump or the surface of said first wiring layer in contact with at least the top of said each bump may be coated with a metal material based on one or more metals selected from gold, silver, platinum, palladium, tin, zinc, lead, nickel or iridium.

According to the present invention, said application of ultrasonic wave may be carried out under pressure.

According to the present invention, said first resin film may include a thermosetting resin and may be precured before an opening is formed by said each bump.

According to the present invention, said first resin film may include a thermosetting polyimide film.

According to the present invention, said each bump may be brought into contact with said first resin film to apply ultrasonic wave after a second resin film is provided on the side of said second wiring layer having said bumps in such a manner that said second resin film is in close contact with said second wiring layer and the top of said each bump projects above said second resin film.

According to the present invention, at least the surface of said second resin film may include a resin developing adhesiveness upon heating.

According to the present invention, said second resin film may be heated during said application of ultrasonic wave.

According to the present invention, at least the surface of said second resin film may consist of a thermoplastic polyimide film.

According to the present invention, said each bump may have a size expressed as the sectional area parallel to said second wiring layer of $19.6 \times 10^{-8}$ m$^2$ or less at maximum.

The present invention also provides a process for manufacturing a multilayer flexible wiring board by using a first single-wiring layer board piece having a first patterned wiring layer and a first resin film in close contact with said first wiring layer, and a second single-wiring layer board piece having a second patterned wiring layer and a plurality of bumps connected to said second wiring layer at the bottoms to laminate said first and second single-wiring layer board pieces into a multilayer flexible wiring board, said process comprising bringing a projection on an ultrasonic manufacturing apparatus into contact with said first resin film, applying ultrasonic wave to said projection to force into said first resin film by said projection to form an opening, and then bringing the top of each of said bumps of said second single-wiring layer board piece into contact with said first wiring layer at the bottom of said opening.

According to this aspect of the present invention, said first wiring layer may be exposed at the bottom of said opening.

According to the present invention, said ultrasonic manufacturing apparatus may have a plurality of said projections to form a plurality of said openings in said first resin film by a single application of ultrasonic wave.

According to the present invention, said each projection may be ultrasonically vibrated in the direction along the surface of said first resin film.

According to the present invention, said first resin film may be formed by applying a liquid raw material on said first wiring layer and curing it by heating, and said opening may be formed in said first resin film in a cured state.

According to the present invention, an adhesive film developing adhesiveness upon heating may be applied after said opening is formed, and said first and second single-wiring layer board pieces may be bonded together via said adhesive film.

The present invention also provides a multilayer flexible wiring board comprising first and second patterned wiring layers, a first resin film interposed between said first and second wiring layers, and a bump connected to said second wiring layer at the bottom, wherein said first resin film has an opening formed by applying ultrasonic wave to said bump to force into it and said bump is left in said opening to electrically connect the top of said bump to said first wiring layer.

According to this aspect of the present invention, a plurality of said openings may be provided and said bump may be left in said each opening.

According to the present invention, said first resin film may include a resin developing adhesiveness upon heating.

According to the present invention, the top of said each bump and said first wiring layer may be ultrasonically bonded to each other.

According to the present invention, the surface of the top of said each bump or the surface of said first wiring layer to be connected to the top of said each bump may be coated with a metal material based on one or more metals selected from gold, silver, platinum, palladium, tin, zinc, lead, nickel or iridium.

The present invention also provides a multilayer flexible wiring board comprising first and second patterned wiring layers, a first resin film interposed between said first and second wiring layers, and a plurality of bumps connected to said second wiring layer at the bottoms, wherein said first rein film has a plurality of openings formed by applying ultrasonic wave to a projection of an ultrasonic manufacturing apparatus to force into it and each of said bumps is located in each of said openings to electrically connect the top of said each bump to said first wiring layer.

According to this aspect of the present invention, said each opening may have an area of $19.6 \times 10^{-8}$ m$^2$ or less.

The present invention also provides an ultrasonic manufacturing apparatus comprising an ultrasonic wave generator generating ultrasonic vibration and a resonator transmitting said ultrasonic vibration, wherein said resonator has a plurality of projections capable of simultaneously coming into contact with a flat surface of a work.

According to this aspect of the present invention, an ultrasonic wave vibrating in the direction parallel to said flat surface of said work may be applied to said each projection.

According to the present invention, said each projection may have a size expressed as the cross sectional area parallel to said second wiring layer of $19.6 \times 10^{-8}$ m$^2$ or less at maximum. When a shape of the bump having a size as cross sectional area parallel to said second wiring board of 19.6×

$10^{-8}$ m$^2$, or a shape of the opening having same size as said bump is circle, for example, the diameter of circle is $5 \times 10^{-4}$ m or less. When the diameter of the projection formed semisphere is $5 \times 10^{-4}$ m or less, the projection height is $2.5 \times 10^{-4}$ m or less. Therefore, the H$_1$ of bump height and projection height are $2.5 \times 10^{-4}$ m or less.

According to the present invention, said ultrasonic wave generator may be oblique to said flat surface of said work.

When said ultrasonic manufacturing apparatus is used to form a plurality of openings in a first single-wiring layer board piece having a first patterned wiring layer and a first resin film in close contact with said first wiring layer, said each projection may be provided at the location corresponding to the location of each bump on a second single-wiring layer board piece to be bonded to said first single-wiring layer board piece.

According to this embodiment of the present invention, said resonator may be replaceable.

The present invention also provides an ultrasonic manufacturing apparatus comprising an ultrasonic wave generator generating ultrasonic vibration and a resonator transmitting said ultrasonic vibration, wherein said resonator has a pressing face to be pressed against a flat surface of a work and said resonator is oblique to said flat surface of said work when said pressing face is pressed against said flat surface of said work.

BRIEF DESCRIPTION OF THE DRAWINGS

FIGS. 4(k)-(n) shows the subsequent steps.

FIGS. 21(g)-(l) shows the subsequent steps.

FIGS. 22(m)-(q) shows the subsequent steps.

DETAILED DESCRIPTION OF PREFERRED EMBODIMENTS

First, a single-wiring layer board piece of the present invention and a process for manufacturing it are explained.

Figure 1A:
FIGS. 1(a)-(g) shows a process for manufacturing a first single-wiring layer board piece for use in a multilayer flexible wiring board according to the present invention.
Figure 1B:
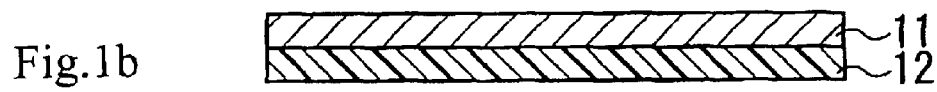

The reference number 11 in FIG. 1(a) represents a metal film consisting of a copper foil. A polyimide varnish including a polyimide precursor is applied on said metal film 11 to form a base film 12 including a polyimide film (FIG. 1(b)).

Figure 1C:
Figure 1D:
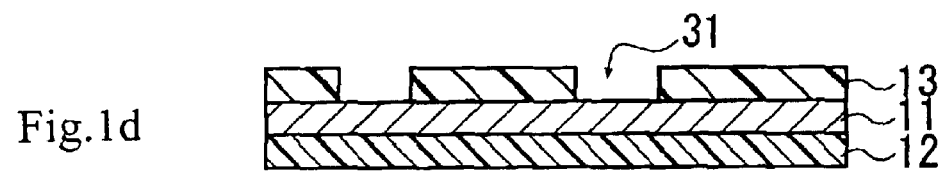
Figure 1E:
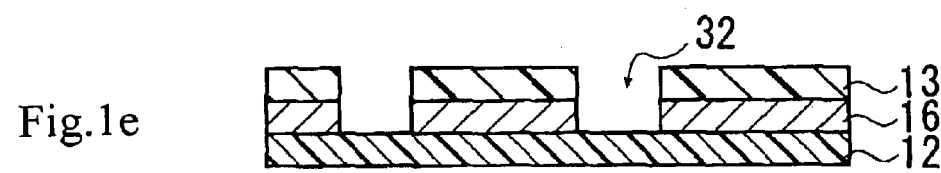

Then, a resist layer 13 is formed on the opposite side of metal film 11 (FIG. 1(c)) and patterned. The reference number 31 in FIG. 1(d) represents an opening in the patterned resist layer 13. Then, resist layer 13 is used as a mask and the assembly is immersed into an etching solution to etch metal film 11, whereby metal film 11 exposed at the bottom of opening 31 is removed. As a result of this etching, metal film 11 is patterned to form a first wiring layer 16 as shown in FIG. 1(e). During etching of metal film 11, base film 12 is not etched.

Figure 1F:
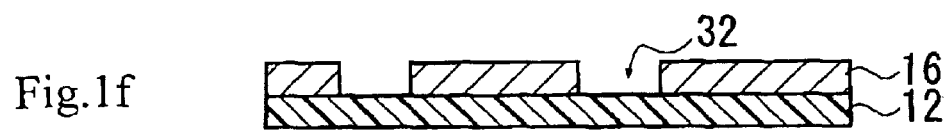

Resist layer 13 is removed (FIG. 1(f)), and a polyimide varnish having the same composition as above is applied on first wiring layer 16 so that the polyimide varnish flows into opening 32 in first wiring layer 16 to form a cover film 17 including a polyimide film having a flat surface all over the surface of first wiring layer 16.

Figure 1G:
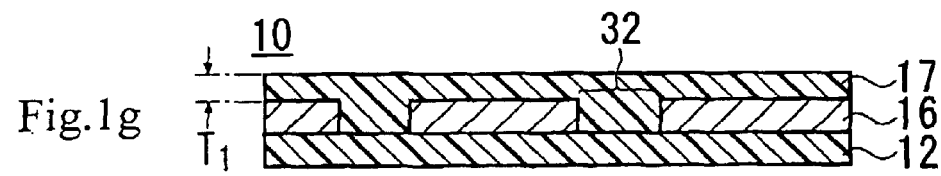

Finally, base film 12 and cover film 17 are imidated by heat treatment into a first single-wiring layer board piece 10 shown in FIG. 1(g). As a result of imidation, base film 12 and cover film 17 have been cured.

Then, a second single-wiring layer board piece to be laminated to first single-wiring layer board piece 10 is explained.

Figure 2A:
FIGS. 2(a)-(e) shows early steps of a process for manufacturing a second single-wiring layer board piece for use in a multilayer flexible wiring board according to the present invention.
Figure 2B:
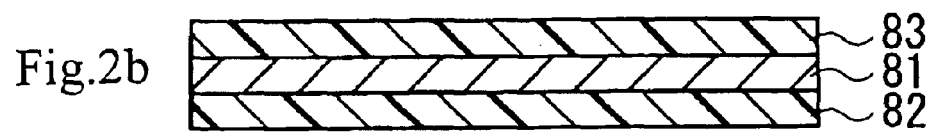
Figure 2C:
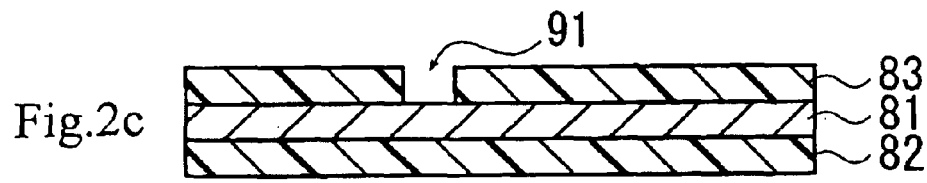

Referring to FIG. 2(a), a metal film 81 consisting of a copper foil is prepared and a protective film 82 is applied to the bottom of metal film 81 while a UV-exposable mask film 83 is applied to the top. Then, mask film 83 is patterned by photographic processes and development processes. Metal film 81 is exposed at the bottoms of a plurality of openings 91 formed by patterning in mask film 83 (FIG. 2(c)).

Figure 2D:
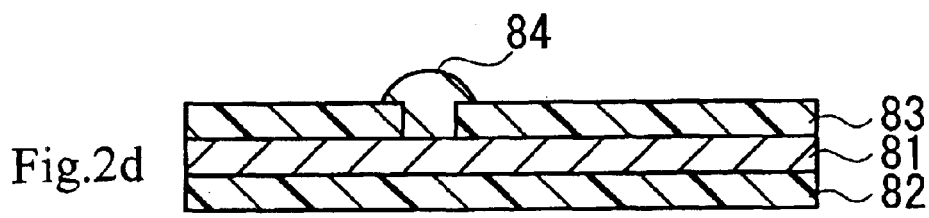

When current is applied across the assembly immersed in a copper plating solution in this state, copper grows at the top of metal film 81 exposed at the bottom of each opening 91 to form a bump 84 of copper in each opening 91 (FIG. 2(d)).

Each bump 84 is connected to metal film 81 at the bottom and projects above mask film 83 at the top. Each bump 84 grows over opening 91 above mask film 83 and becomes greater than opening 91. Each bump 84 normally has a maximum size at the part in contact with mask film 83.

Opening 91 is normally in the form of a circle having a diameter between 100 μm and 250 μm, and the maximum diameter of bump 84 taken along the direction parallel to metal film 81 is about 200 μm for opening 91 having a diameter of 100 μm or about 500 μm for opening 91 having a diameter of 250 μm.

Therefore, the cross area of bump 84 taken along the direction parallel to metal film 81 is between $3.14 \times 10^{-8}$ m$^2$ and $19.6 \times 10^{-8}$ m$^2$.

Although only one bump 84 is shown in FIG. 2(d), a plurality of bumps 84 are formed on metal film 81 to correspond to a plurality of openings 91.

Figure 2E:
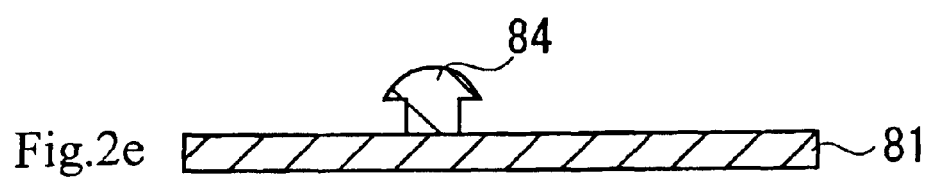

Then, mask film 83 and protective film 82 are removed so that a plurality of bumps 84 are upright on one side of metal film 81 as shown in FIG. 2(e).

Figure 3F:
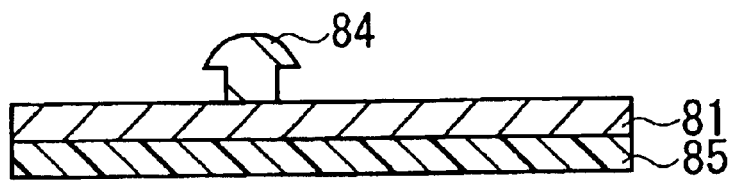
FIGS. 3(f)-(j) shows the subsequent steps.
Figure 3G:
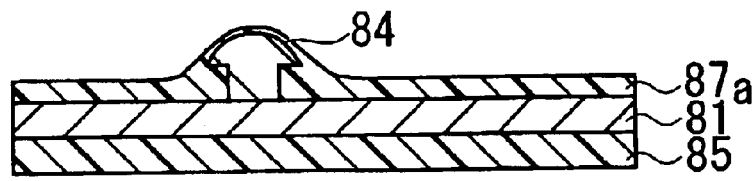

In this state, a carrier film 85 is applied on the opposite side to the side on which bumps 84 are formed (FIG. 3(f)). Then, a polyimide varnish including a polyimide precursor is applied and dried on the side on which bumps 84 are formed, whereby an insulating layer $87_a$ including a polyimide layer is formed (FIG. 3(g))

Figure 3H:
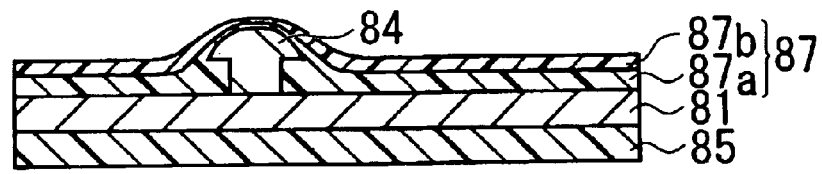

Then, an adhesive polyimide varnish is overcoated on insulating layer $87_a$ to form an adhesive layer $87_b$, whereby a cover film 87 including a double-layer polyimide film is obtained (FIG. 3(h)). The surface of this cover film 87 has the property of developing adhesiveness upon heating and insulation.

Figure 3I:
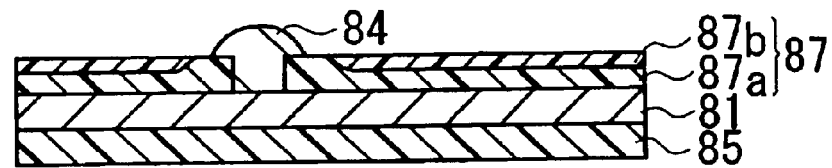

This cover film 87 is thicker on the surface of metal film 81 and thinner on the top of bump 84. Thus, the part of each bump 84 projecting above cover film 87 is exposed when an alkali solution is sprayed on the surface of cover film 87 to etch the surface of cover film 87 (FIG. 3(i)).

Figure 3J:
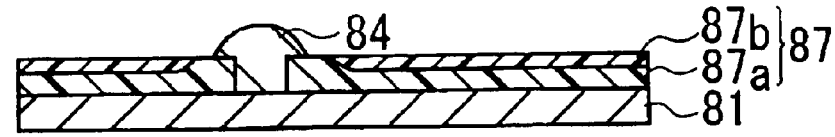

Then, carrier film 85 on the bottom of metal film 81 is separated (FIG. 3(j)), and instead a resist layer is formed and patterned by exposure and development.

The reference number 88 in FIG. 4(k) represents the resist layer patterned to have a plurality of openings 91. The surface of metal film 81 is exposed at the bottom of each opening 91.

Metal film 81 exposed at the bottom of each opening 91 is etched in this state from the bottom side to pattern metal film 81 in conformity to the pattern of resist layer 88.

The reference number 86 in FIG. 4(l) represents a second wiring layer formed by patterning in metal film 81. The reference number 92 represents an opening segmenting second wiring layer 86.

Then, resist layer 88 is removed (FIG. 4(m)) and a polyimide varnish including a polyimide precursor is applied on the surface of wiring layer 86 so that the polyimide varnish flows into opening 92 in wiring layer 86 to form a base film 89 including a polyimide film having a flat surface. The reference number 80 in FIG. 4(n) represents a second single-wiring layer board piece having base film 89.

Next, a process for manufacturing a multilayer wiring board using said first and second single-wiring layer board pieces 10, 80 is explained.

Figure 5A:
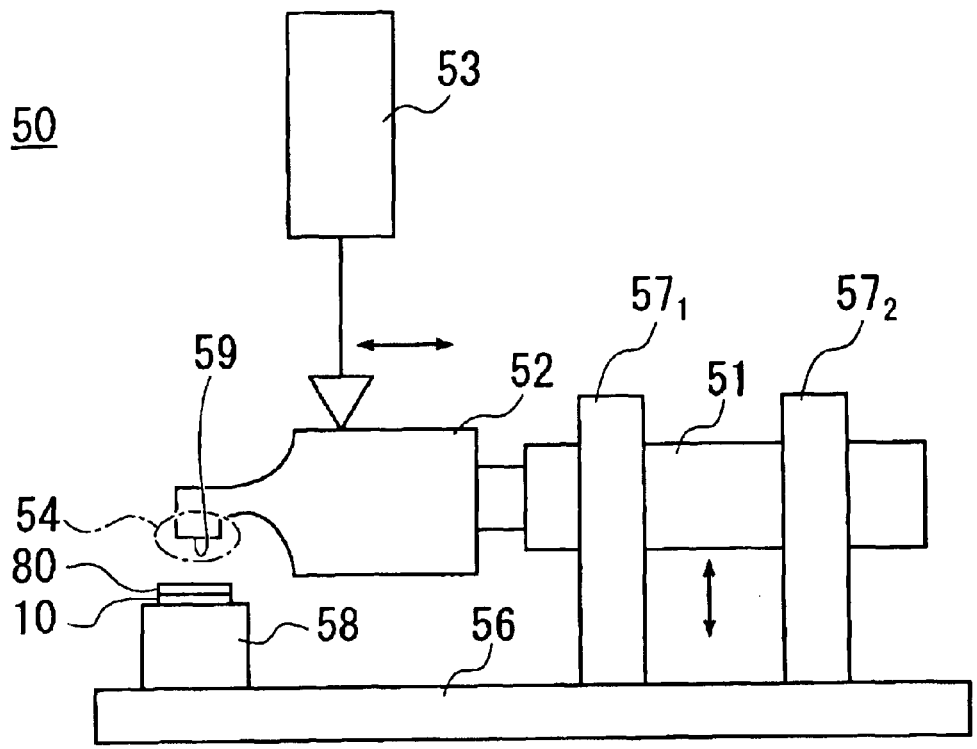
FIG. 5 shows an ultrasonic manufacturing apparatus according to the present invention.

The reference number 50 in FIG. 5(a) represents an ultrasonic manufacturing apparatus according to the present invention.

This ultrasonic manufacturing apparatus 50 comprises a platform 56, two guide posts $57_1$, $57_2$ upright on platform 56, a cylindrical ultrasonic wave generator 51 fitted to be vertically movable to guide posts $57_1$, $57_2$, and a resonator 52 attached to an end of ultrasonic wave generator 51.

A flat support 58 is mounted on platform 56 and a first single-wiring layer board piece 10 is placed on the top of support 58 with base film 12 downward and cover film 17 upward.

Figure 7A:
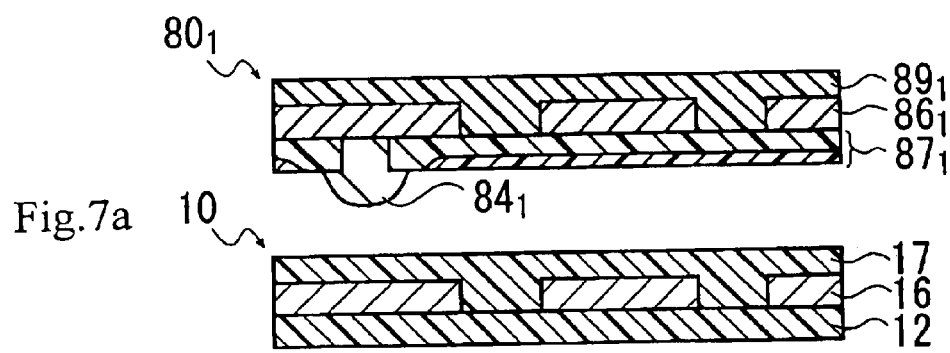
FIGS. 7(a)-(c) shows a process for manufacturing a multilayer flexible wiring board according to the present invention.

The reference number $80_1$ in FIG. 7(a) represents a second single-wiring layer board piece. This second single-wiring layer board piece $80_1$ has a plurality of bumps $84_1$ of almost the same height in contact with cover film 17 of first single-wiring layer board piece 10 at the tops. First and second single-wiring layer board pieces 10, $80_1$ are superposed in this state.

Figure 5B:
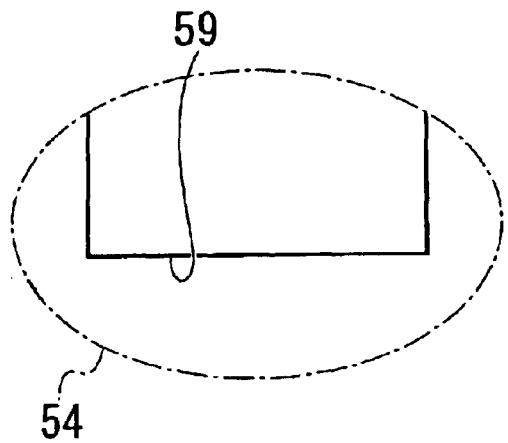

Resonator 52 has a head portion 54 having a flat pressing face 59 to be contacted with a work. FIG. 5(b) shows an enlarged view of head portion 54. Pressing face 59 to be contacted with a work is in parallel with the surface of support 58. When a cylinder 53 on ultrasonic manufacturing apparatus 50 is activated so that ultrasonic wave generator 51 and resonator 52 vertically descend along guide posts $57_1$, $57_2$, head portion 54 comes into close contact with second single-wiring layer board piece $80_1$ (FIG. 7(b)).

When ultrasonic wave generator 51 is activated to generate ultrasonic wave while second single-wiring layer board piece $80_1$ is pressed against first single-wiring layer board piece 10 by head portion 54, the ultrasonic wave is transmitted to resonator 52 to apply ultrasonic vibration from head portion 54 of resonator 52 to second single-wiring layer board piece $80_1$.

First single-wiring layer board piece 10 on support 58 is fixed in this state so that a plurality of bumps $84_1$ simultaneously ultrasonically vibrate in the direction parallel to the surface of first single-wiring layer board piece 10, whereby each bump $84_1$ forces into the resin constituting cover film 17 of first single-wiring layer board piece 10 to penetrate into the cover film.

The reference number $H_1$ in FIG. 4(n) represents the height of each bump $84_1$ above the surface of cover film 87, and $T_1$ in FIG. 1(g) represents the thickness of cover film 17 into which bump $84_1$ penetrates. The height $H_1$ of each bump $84_1$ is greater than the thickness $T_1$ of cover film 87 ($H_1 > T_1$).

Figure 7B:
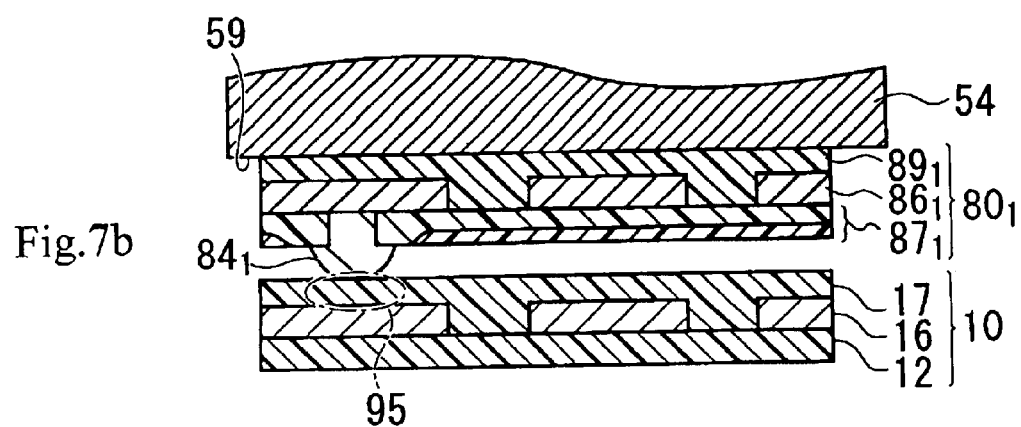

First wiring layer 16 underlies cover film 17 in contact with bump $84_1$. As ultrasonic wave is applied to the bump $84_1$, the part of cover film 17 between bump $84_1$ and first wiring layer 16 is softened and an opening is formed. Bump $84_1$ is pressed into the opening. The cover film 17 forced by the bump $84_1$ is risen around the opening. The reference number 95 in FIG. 7(b) represents the part of cover film 17 to be forced by bump $84_1$.

When the top of bump $84_1$ comes into contact with first wiring layer 16 and ultrasonic application continues in this state, the top of bump $84_1$ is ultrasonically bonded to first wiring layer 16.

When bump $84_1$ is in contact with or connected to first wiring layer 16, first single-wiring layer board piece 10 placed on support 58 begins to ultrasonically vibrate in synchronism with second single-wiring layer board piece $80_1$ so that bump $84_1$ cannot pierce first wiring layer 16.

When bump $84_1$ comes into contact with first wiring layer 16, cover film 87 of second single-wiring layer board piece $80_1$ comes into close contact with cover film 17 of first single-wiring layer board piece 10. Therefore, if ultrasonic wave is applied to press second single-wiring layer board piece $80_1$ against first single-wiring layer board piece 10 while directly heating second single-wiring layer board piece $80_1$ by a heater in resonator 52 or platform 58 or heating second single-wiring layer board piece $80_1$ via first single-wiring layer board piece 10, heated cover film 87 develops adhesiveness to bond cover films 87, 17 together.

As a result, first and second single-wiring layer board pieces 10, 80₁ are bonded together into a single multilayer flexible wiring board 41. Electric connection between first and second wiring layers 16, 86₁ of first and second single-wiring layer board piece 10, 80₁ is ensured via bumps 84₁.

As described above, the present invention allows wiring layers to be connected to each other by using bumps to form openings without preliminarily exposing the wiring layers.

The height $H_1$ of bump 84₁ should be greater than the thickness $T_1$ of cover film 87 to be ultrasonically forced above first wiring layer 16 to ensure connection between each bump 84₁ and first wiring layer 16.

First single-wiring layer board pieces were prepared by varying the thickness $T_1$ of cover film 17 above first wiring layer 16 and a second single-wiring layer board piece having bumps 84₁ of 20 μm in height $H_1$ was laminated by the process described above to prepare multilayer flexible wiring boards. Then the various thickness of cover film 17 was tested for the resistance at the connection zone. The relationship between the thickness $T_1$ of cover film 17 and the resistance value at the zone connected by bumps 84₁ is shown in the following Table 1.

In the following Table 1, the cover film thickness of "0" corresponds to the case in which cover film 17 of first single-wiring layer board piece 10 was opened to bring bumps into direct contact with the wiring layer.

TABLE 1

| Bump height and connection resistance (bump height 20 μm) | | | | | | |
|---|---|---|---|---|---|---|
| Thickness of cover film $T_1$ (μm) | 5 | 10 | 15 | 20 | 25 | 0 |
| Connection resistance (Ω) | 0.5 | 0.5 | 0.5 | ∞ (open) | ∞ (open) | 0.5 |

During preparation of multilayer flexible wiring boards, a load of 3–7 kg was applied per bump 84₁ under ultrasonic wave application.

The thickness of cover film 87 above second wiring layer 86 having bumps 84₁ is 20 μm, and therefore, the height of bump 84₁ from second wiring layer 86 is 40 μm. Bump 84₁ is in the form of a circle having a maximum diameter of 150 μm. First wiring layer 16 was patterned in the form of a circle of 250 μm in diameter at the part to be connected to bump 84₁.

Table 1 shows that the connection resistance obtained by opening a cover film is reproduced when the bump height $H_1$ is greater than the thickness of the resin film to be forced into, or the thickness of the resin film above the wiring layer is smaller than the height of bumps projecting from the resin film.

Next, the step of further laminating a single-wiring board piece to multilayer flexible wiring board 41 is explained.

Figure 7C:
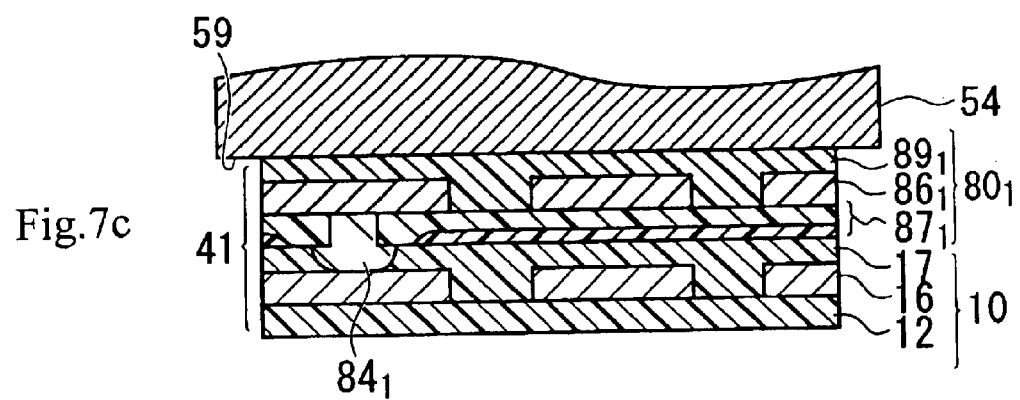
Figure 8A:
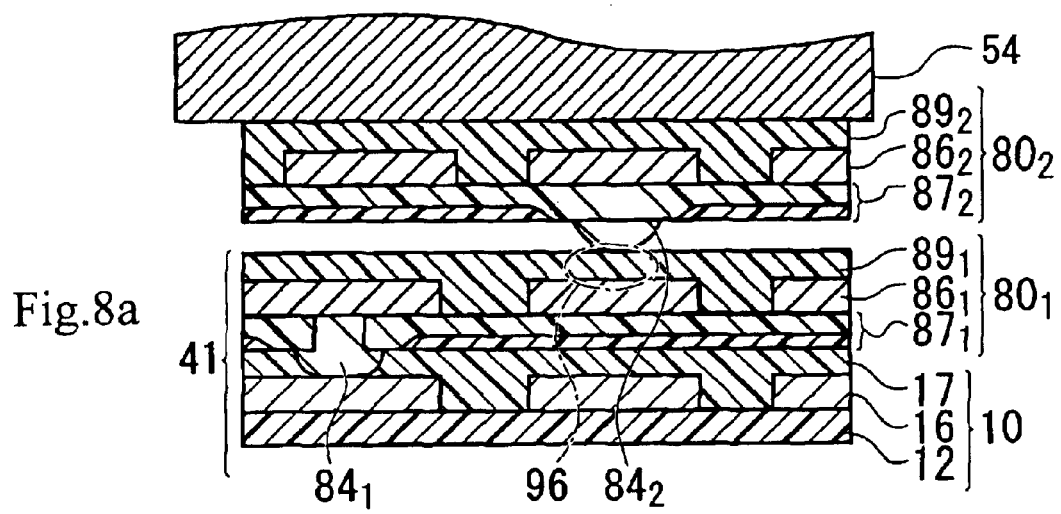
FIGS. 8(a),(b) shows the step of further multiplying said multilayer flexible wiring board.

As shown in FIG. 8(a), a secondary piece of second single-wiring layer board piece 80₂ is superposed on base film 89₁ of second single-wiring layer board piece 80₁ constituting multilayer flexible wiring board 41 shown in FIG. 7(c) with bumps 84₂ being in contact with said base film 89₁, and head portion 54 of resonator 52 is brought into contact with base film 89₂ of secondary piece of second single-wiring layer board piece 80₂.

When ultrasonic wave is applied to secondary piece of second single-wiring layer board piece 80₂ under pressure in this state, bumps 84₂ force and penetrate into base film 89₁ on the top of multilayer flexible wiring board 41.

The reference $T_2$ in FIG. 4(n) represents the thickness of base film 89 of second single-wiring layer board piece above second wiring layer 86.

This thickness $T_2$ is smaller than the bump height $H_1$ and corresponds to the thickness of base film 89₁ in contact with bump 84₂, so that bump 84₂ penetrates into base film 89₁ at the site 96 located between bump 84₂ and wiring layer 86₁ to connect bump 84₂ to second wiring layer 86₁ underlying base film 89₁.

Figure 8B:
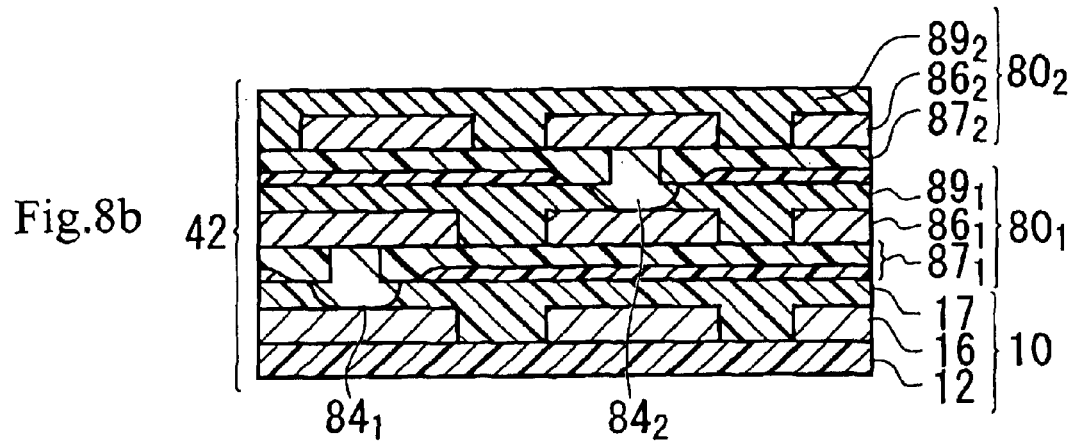

The reference number 42 in FIG. 8(b) represents thus formed multilayer flexible wiring board having a trilayer structure. First wiring layer 16 and two other wiring layers 86₁, 86₂ are connected via bumps 84₁, 84₂ to electrically connect desired wiring of a plurality of wiring layers 16, 86₁, 86₂.

Although first and other wiring layers 16, 86₁, 86₂ and bumps 84₁, 84₂ consist of copper to provide direct ultrasonic connection via copper in the foregoing embodiments, either one or both of wiring layers and bumps may be coated with a metal having better ultrasonic connectivity than copper such as a gold coat or solder coat.

Figure 9A:
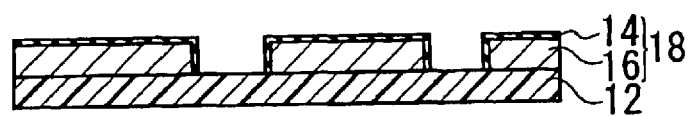
FIGS. 9(a)-(d) shows a process for manufacturing an alternative single-wiring layer board piece according to the present invention and a process for manufacturing a multilayer flexible wiring board using said single-wiring layer board piece.

Referring to FIG. 9(a), the assembly of base film 12 and first wiring layer 16 in the state of FIG. 1(f) is first immersed into a gold plating solution to form a gold-based metal coat 14 on the surface of at least first wiring layer 16 by electroplating. The reference number 18 represents a first wiring layer having metal coat 14 on the surface.

Figure 9B:
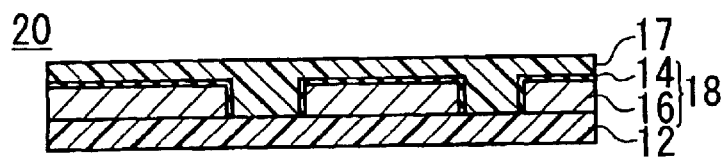

Then, a polyimide varnish is applied on first wiring layer 18 to imidate it into a cover film 17, whereby a first single-wiring layer board piece 20 having metal coat 14 as shown in FIG. 9(b) is obtained.

Figure 9C:
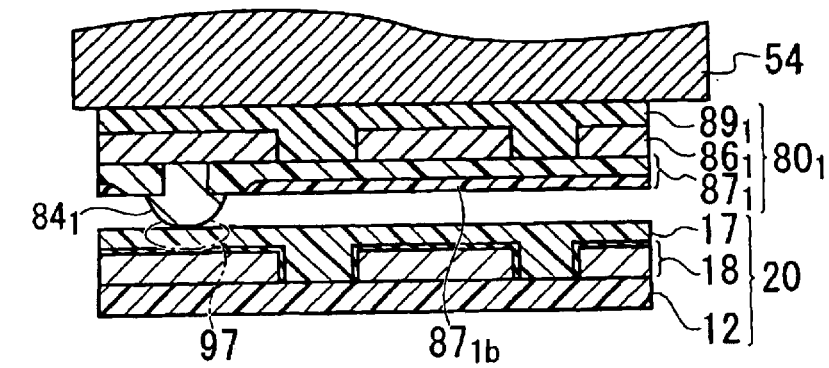

FIG. 9(c) shows that a plurality of bumps 84₁ of second single-wiring layer board piece 80₁ are in contact with cover film 17 of first single-wiring layer board piece 20 and that head portion 54 of resonator 52 is pressed against base film 89₁ of second single-wiring layer board piece 80₁.

When ultrasonic vibration is given to resonator 52 in this state to ultrasonically vibrate bumps 84₁ in the direction parallel to the surface of cover film 17, bumps 84₁ penetrate into cover film 17 until the tops of bumps 84₁ come into contact with metal coat 14.

Figure 9D:
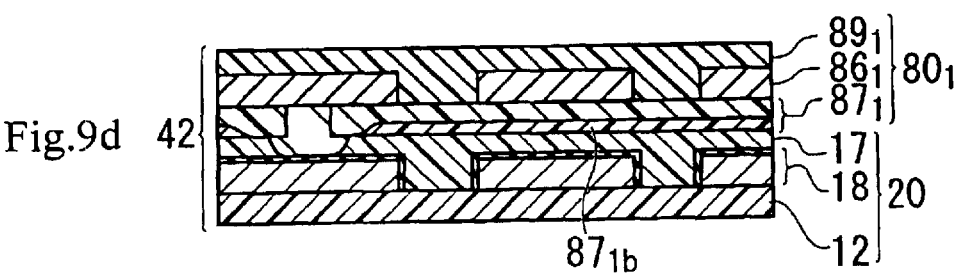

When ultrasonic wave is applied while the tops of bumps 84₁ are pressed against metal coat 14, the tops of bumps 84₁ are ultrasonically bonded to metal coat 14. During ultrasonic connection, cover film 87₁ of second single-wiring layer board piece 80₁ is pressed against the surface of cover film 17 of first single-wiring layer board piece 20. Therefore, if cover film 87₁ of second single-wiring layer board piece 80₁ is heated by a heater in resonator 52 or platform 58 to develop adhesiveness of adhesive layer 87₁b on the surface of cover film 87₁, first and second single-wiring layer board pieces 20, 80₁ are bonded together into a single multilayer flexible wiring board 42 as shown in FIG. 9(d).

Although metal coat 14 was provided on the side of first wiring layer 18 in this example, it may also be provided on the top of bump 84₁.

Although an adhesive layer was used to adhere single-wiring layer board pieces into a multilayer flexible wiring board in the foregoing embodiments, a multilayer flexible wiring board may also be formed only by connection force between bumps and wiring layers.

Although polyimide films were used as resin films in the foregoing embodiments, the present invention is not limited to these embodiments but also applicable to other rein films such as polyethylene films, polyester films, epoxy films, etc. Wiring layers may also include other metals such as aluminum instead of copper.

Figure 6:
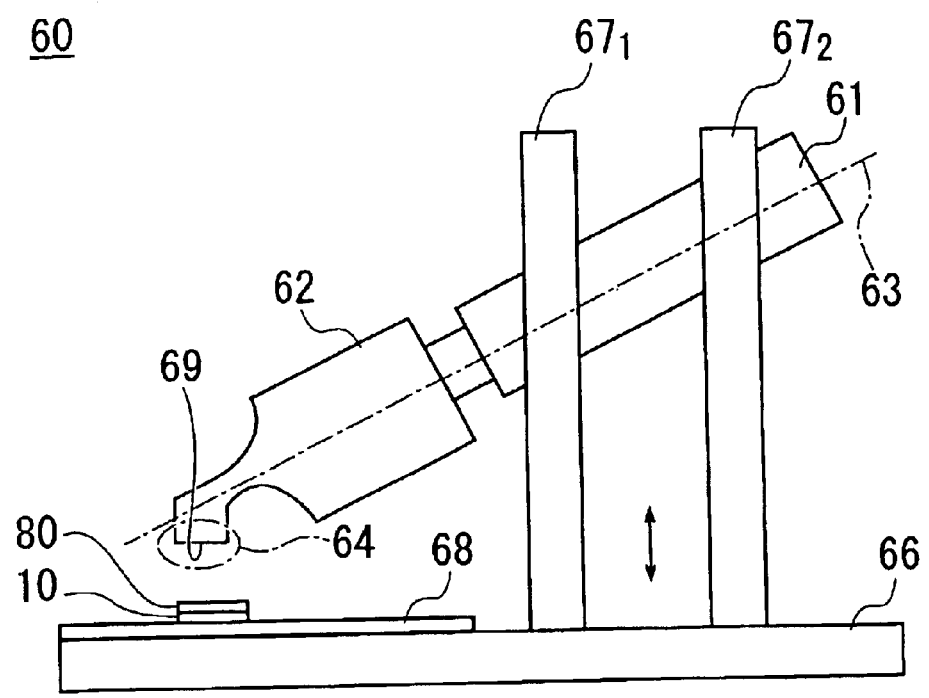
FIG. 6 shows an alternative ultrasonic manufacturing apparatus according to the present invention.

Although a general-purpose ultrasonic manufacturing apparatus 50 was used in the foregoing embodiments, the present invention also includes an ultrasonic manufacturing apparatus 60 in which central axis 63 of ultrasonic wave generator 61 and resonator 62 is inclined from the horizontal direction as shown in FIG. 6.

In this ultrasonic manufacturing apparatus 60, head portion 64 of resonator 62 is oblique to ultrasonic wave generator 61 and resonator 62. Head portion 64 has a flat pressing face 69, which is designed to be horizontal when the assembly is obliquely fitted to guide posts $67_1$, $67_2$.

Although ultrasonic manufacturing apparatus 50 described before had to place single-wiring layer board pieces 10, 80 on support 58, resonator 62 cannot strike platform 68 or support 68 when the inclination of central axis 63 from the horizontal direction is adjusted between 5° and 60° in ultrasonic manufacturing apparatus 60. Thus, a large-area support 68 can be used, whereby single-wiring layer board pieces 10, 80 can be easily placed.

As has been described above, the present invention can simplify the process for manufacturing a multilayer flexible wiring board by connecting bumps to wiring layers without providing openings in a resin film.

Although gold-based metal coat 14 was provided in the foregoing embodiments, either one or both of the surfaces of at least the tops of bumps or the surface of the first wiring layer in contact with at least the tops of bumps may be coated with a metal material based on one or more metals selected from gold, silver, platinum, palladium, tin, zinc, lead, nickel or iridium.

Next, an alternative multilayer flexible wiring board according to the present invention and a process for manufacturing it are explained.

Figure 10A:
FIGS. 10(a)-(f) shows a process for manufacturing a multilayer flexible wiring board according to the present invention before an opening is formed.
Figure 10B:
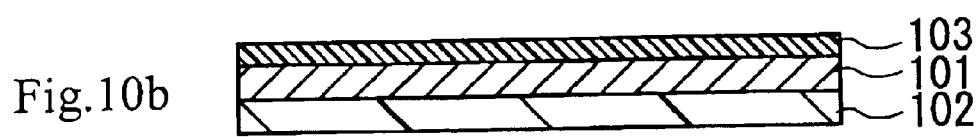
Figure 10C:
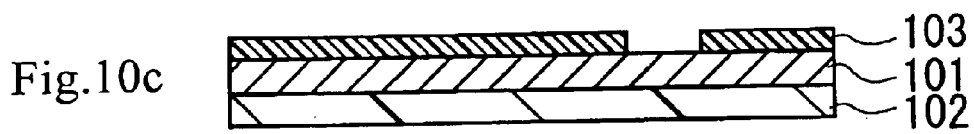

Referring to FIG. 10(a), the reference number 101 represents a metal film consisting of a copper foil of 18 μm–30 μm in thickness having a carrier film 102 including a resin film applied to the bottom. A photosensitive film 103 is applied to the top of this metal film 101 (FIG. 10(b)), and photosensitive film 103 is patterned by exposure and development (FIG. 10(c)).

Figure 10D:
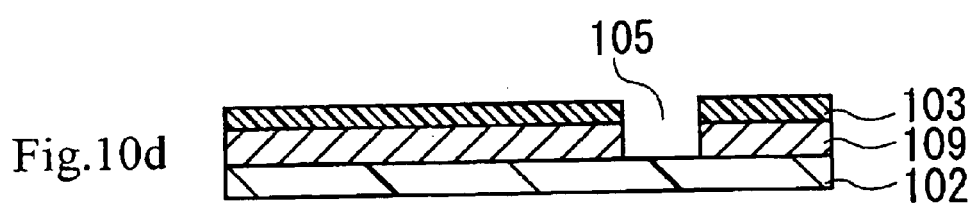

Then, patterned photosensitive film 103 is used as a mask for alkali etching to pattern metal film 101 to form a first wiring layer 109 (FIG. 10(d)). The reference 105 in FIG. 10(d) represents a groove formed by patterning in first wiring layer 109 or a part segmenting the wiring. The top of carrier film 102 is exposed at the bottom of this groove 105.

Figure 10E:
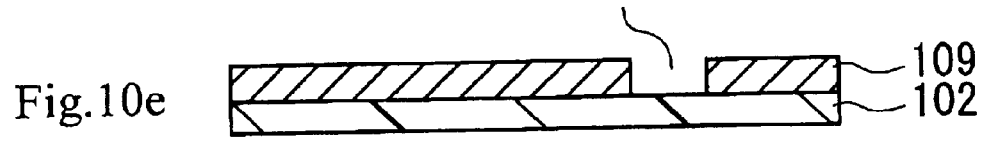
Figure 10F:
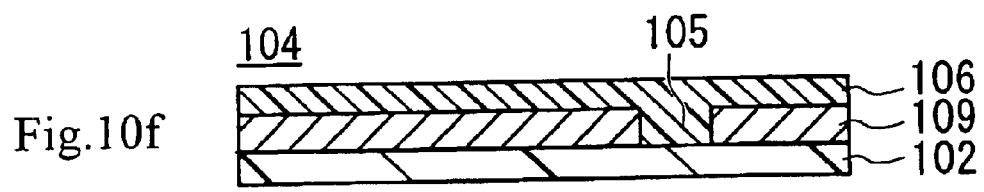

Then, photosensitive film 103 is separated to expose first wiring layer 109 (FIG. 10(e)), and a polyimide precursor solution is applied on its top to fill groove 105 with the polyimide precursor solution. Imidation by heating in this state gives a base film 106 including a thermosetting polyimide resin film (FIG. 10(f)). This base film 106 has a flat surface. The reference number 104 in FIG. 10(f) represents a single-wiring layer board piece having base film 106.

This single-wiring layer board piece 104 is placed as a work in an ultrasonic manufacturing apparatus to form an opening in base film 106.

Figure 15:
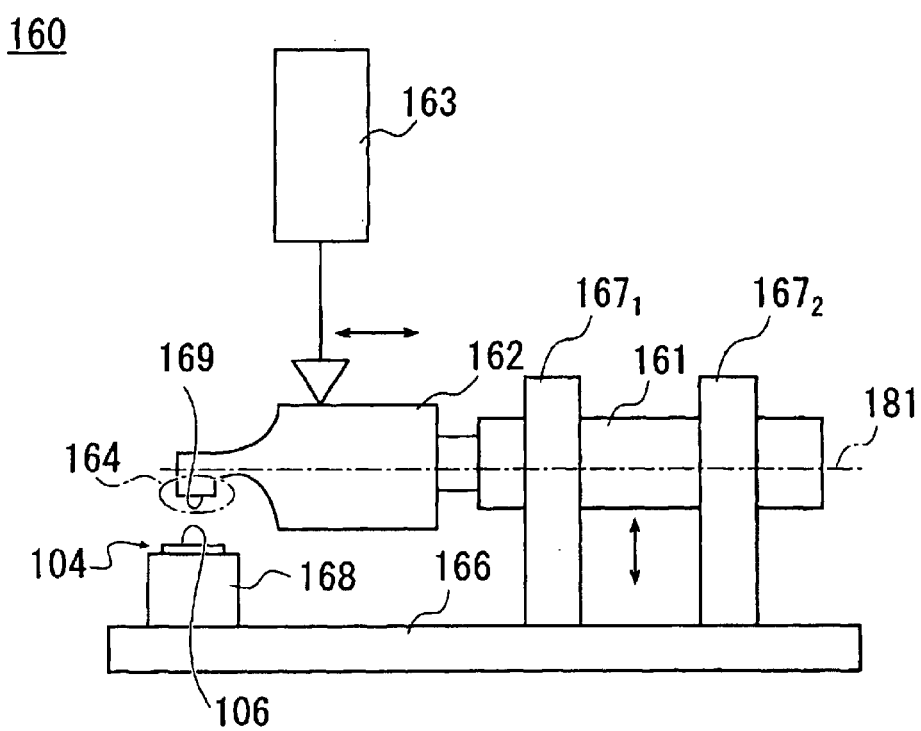
FIG. 15 shows an alternative ultrasonic manufacturing apparatus according to the present invention.

The reference 160 in FIG. 15 represents an ultrasonic manufacturing apparatus of the present invention used for forming an opening. This ultrasonic manufacturing apparatus 160 comprises a cylindrical ultrasonic wave generator 161, a resonator 162 applying ultrasonic vibration to a work, a platform 166 and two guide posts $167_1$, $167_2$.

Guide posts $167_1$, $167_2$ are upright on platform 166 and ultrasonic wave generator 161 is fitted to guide post $167_1$, $167_2$ in such a manner that it can vertically move in a horizontal position.

One end of resonator 162 is fitted to an end of ultrasonic wave generator 161, while the other end is bent so that its end face 169 is parallel with central axis 181 of ultrasonic wave generator 161 and resonator 162.

Figure 16:
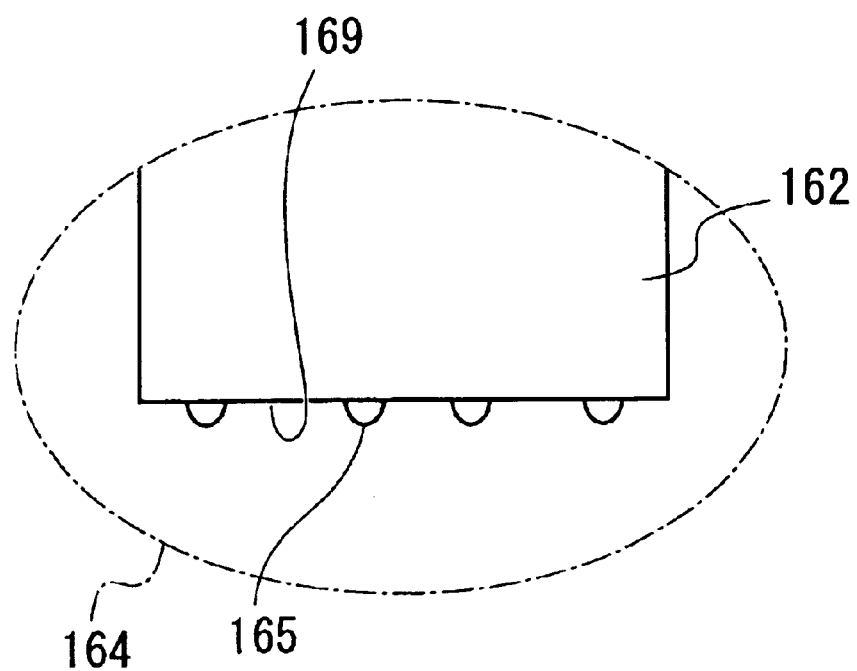
FIG. 16 is an enlarged view of its head portion.

FIG. 16 shows an enlarged view of head portion 164 of resonator 162. Head portion 164 has a pressing face 169, which is horizontally positioned when ultrasonic wave generator 161 and resonator 162 are fitted to guide posts $167_1$, $167_2$ in such a manner that pressing face 169 faces downward and central axis 181 is horizontal.

Pressing face 169 has a plurality of projections 165 each facing vertically downward when pressing face 169 is in a horizontal position.

A flat support 168 is mounted on platform 166 and a work (single-wiring layer board piece 104) is placed on the top of support 168 with base film 106 to be opened upward, whereby pressing face 169 of resonator 162 and base film 106 are faced in parallel to each other in a horizontal position.

When an air cylinder 163 located over resonator 162 is activated so that ultrasonic wave generator 161 and resonator 162 vertically descend along guide posts $167_1$, $167_2$, all the projections 165 on pressing face 169 simultaneously come into contact with base film 106. Each projection 165 comes into contact with base film 106 at vertical angles.

Figure 11G:
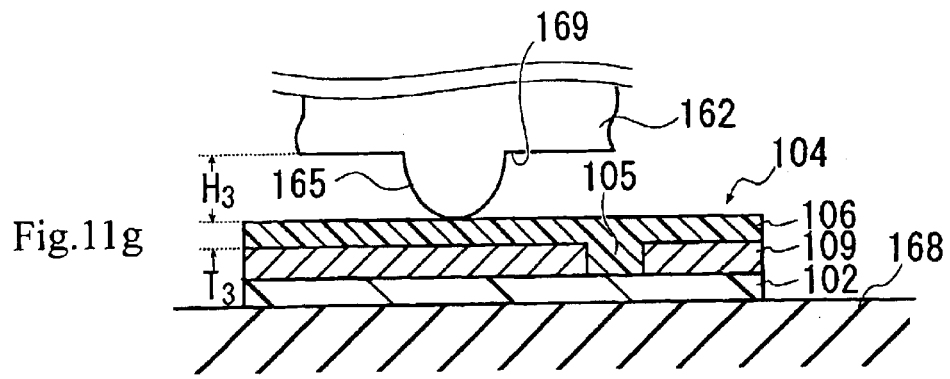
FIGS. 11(g)-(i) shows the step of forming an opening according to the present invention.

This state is shown in FIG. 11(g), in which each projection 165 on pressing face 169 has almost the same height $H_3$ from pressing face 169, so that each projection 165 almost simultaneously comes into contact with base film 106 when resonator 162 vertically descends.

When ultrasonic wave generator 161 is activated while each projection 165 is in contact with base film 106, the resulting ultrasonic vibration is transmitted to each projection 165 via resonator 162.

The direction of ultrasonic vibration generated in ultrasonic wave generator 161 has almost no components vertical to ultrasonic wave generator 161 but consists of only components parallel to central axis 181 of ultrasonic wave generator 161. When ultrasonic vibration generated in horizontal ultrasonic wave generator 161 is transmitted to projection 165, each projection 165 ultrasonically vibrates in the horizontal direction.

Each projection 165 ultrasonically vibrates while it is pressed against base film 106 by air cylinder 163, but single-wiring layer board piece 104 to be worked remains fixed to support 168 by frictional force.

Figure 11H:
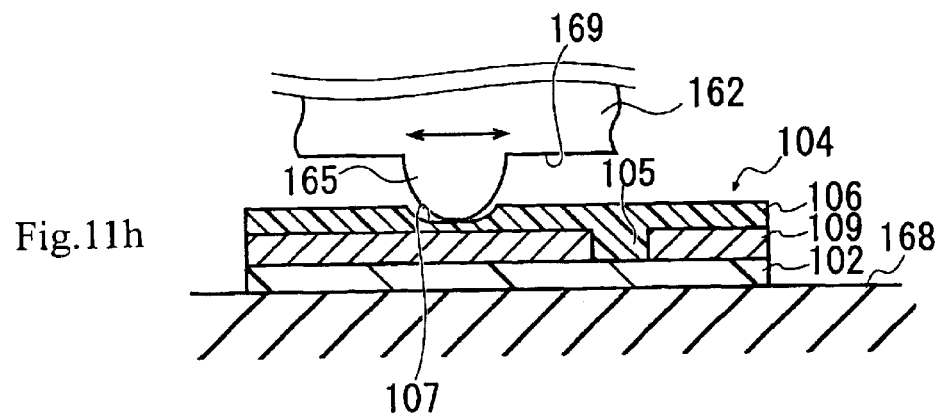

Thus, projection 165 softens base film 106 by ultrasonic vibration energy and each projection 165 forces into base film 106. Each projection 165 having a semispherical shape here forces into base film 106 with a curved face forming the surface of each projection 165 to form an elliptic recess having a major axis in the vibration direction of ultrasonic wave. The reference number 107 in FIG. 11(h) represents such a recess. A part of base film 106 forced by projection 165 is risen around the recess 107.

The position of each opening 107 to be formed in base film 106 is predetermined and each projection 165 is located at the position corresponding to each opening 107. First wiring layer 109 but not groove 105 exists under each projection 165 because first wiring layer 109 should be exposed at the bottom of the opening 107 to be formed in base film 106.

The height $H_3$ of each projection 165 here is greater than the thickness $T_3$ of base film 106 ($H_3 > T_3$), so that the top of each projection 165 reaches first wiring layer 109 before pressing face 169 comes into contact with base film 106, as forcing proceeds.

Figure 11I:
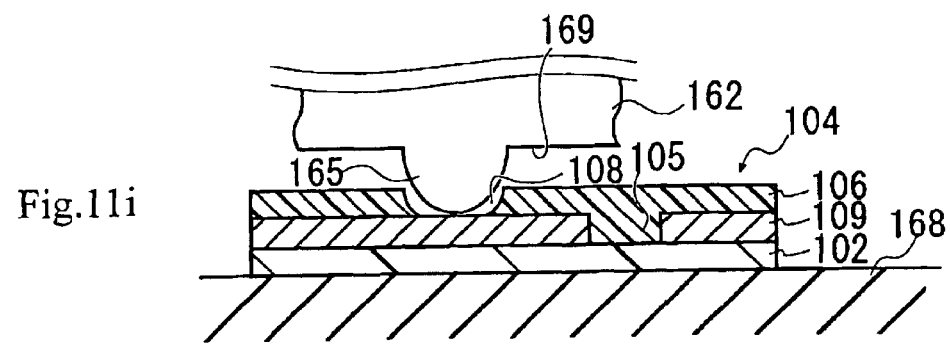

This state is shown in FIG. 11(i). Projection 165 under ultrasonic vibration is pressed against first wiring layer 109 to ultrasonically vibrate first wiring layer 109 in synchronism with projection 165, so that no more ultrasonic vibration energy is applied to first wiring layer 109 to stop forcing. As a result, an opening 108 is formed in base film 106 with first wiring layer 109 exposed at the bottom. The number of openings 108 is identical to the number of projections 165.

Figure 12J:
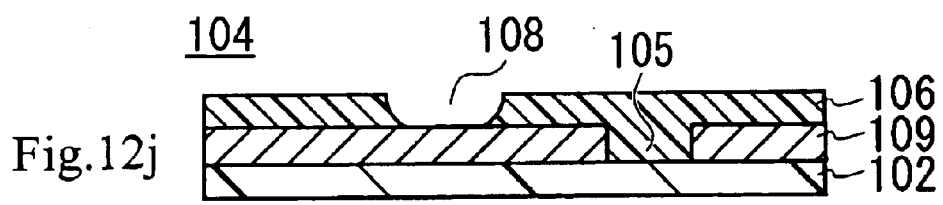
FIGS. 12(j)-(m) shows steps after an opening is formed according to the present invention.

After openings 108 have been formed, ultrasonic wave generator 161 is stopped and air cylinder 163 is activated so that resonator 162 and ultrasonic wave generator 161 ascend along guide posts $167_1$, $167_2$ to remove single-wiring layer board piece 104 having openings 108 from support 168. FIG. 12(j) shows single-wiring layer board piece 104 in this state. If one wishes to continuously form openings, processed single-wiring layer board piece 104 may be replaced by an unprocessed flexible wiring board, which is then forced by ultrasonic vibration.

Figure 19A:
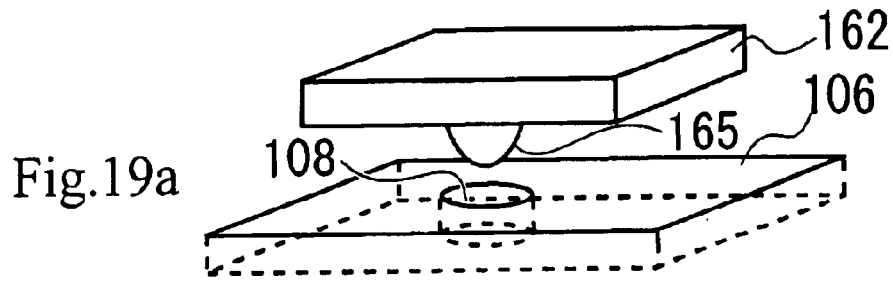
FIGS. 19(a)-(d) shows embodiments of the opening according to the present invention.
Figure 19B:
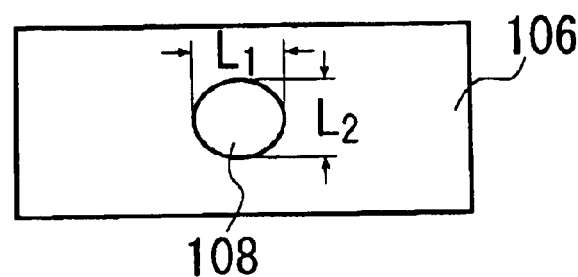

FIG. 19(a) is a perspective view of opening 108 formed in base film 106 using semispherical projection 165. FIG. 19(b) is a plan view of opening 108 seen from the upside of base film 106. The direction of ultrasonic vibration is the direction of major diameter $L_1$, with major diameter $L_1 >$ minor diameter $L_2$.

Figure 19C:
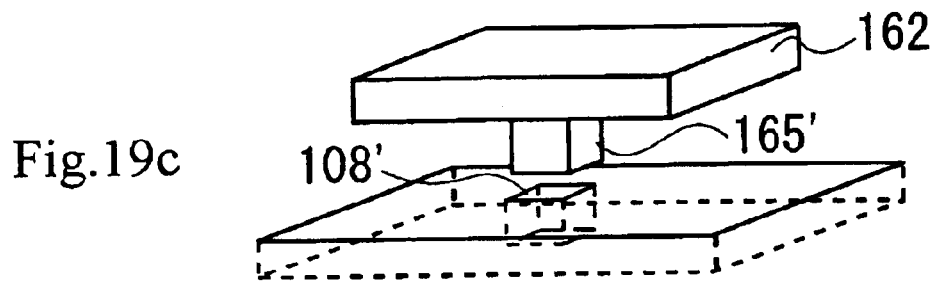
Figure 19D:
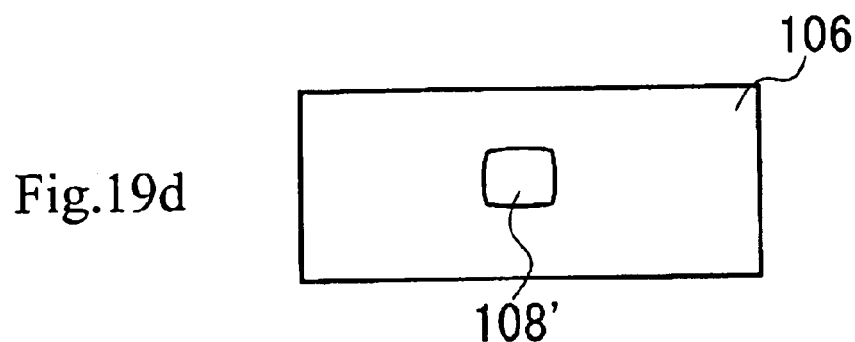
Figure 20A:
FIGS. 20(a)-(f) shows early steps of a process for manufacturing a single-wiring layer board piece for use in a multilayer flexible wiring board.
Figure 20B:
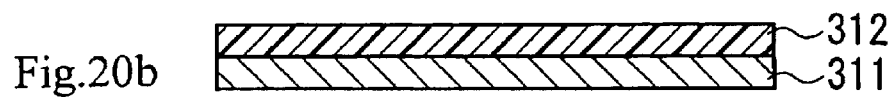
Figure 20C:
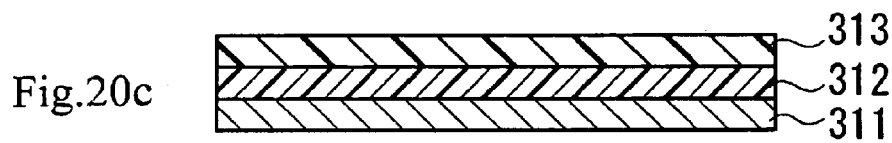
Figure 20D:
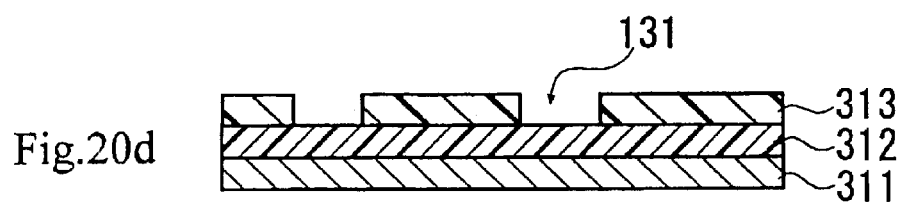
Figure 20E:
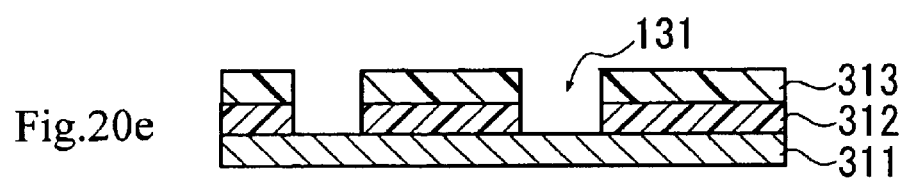
Figure 20F:
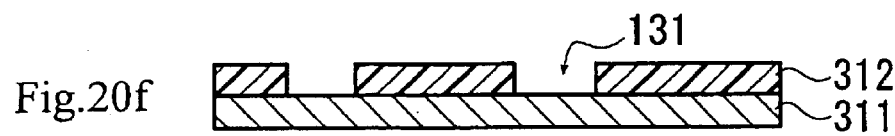
Figure 21G:
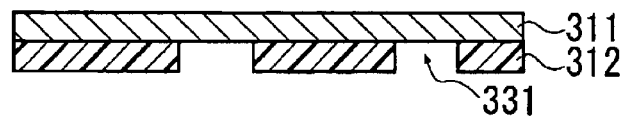
Figure 21H:
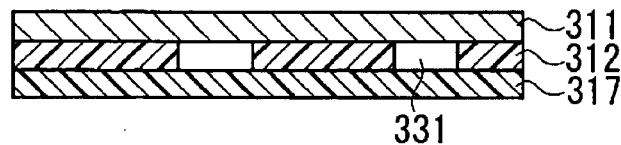
Figure 21I:
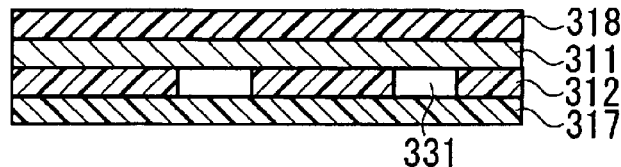
Figure 21J:
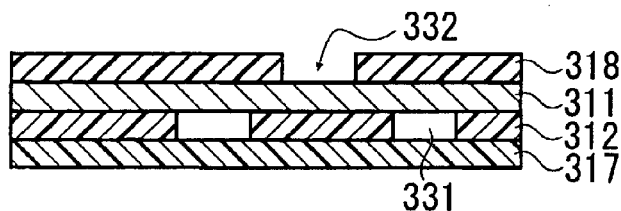
Figure 21K:
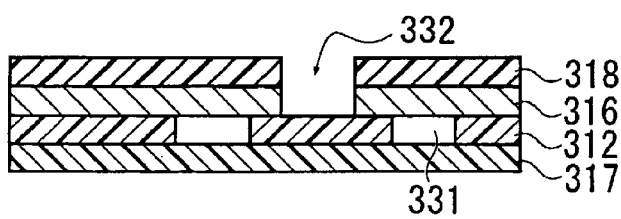
Figure 23A:
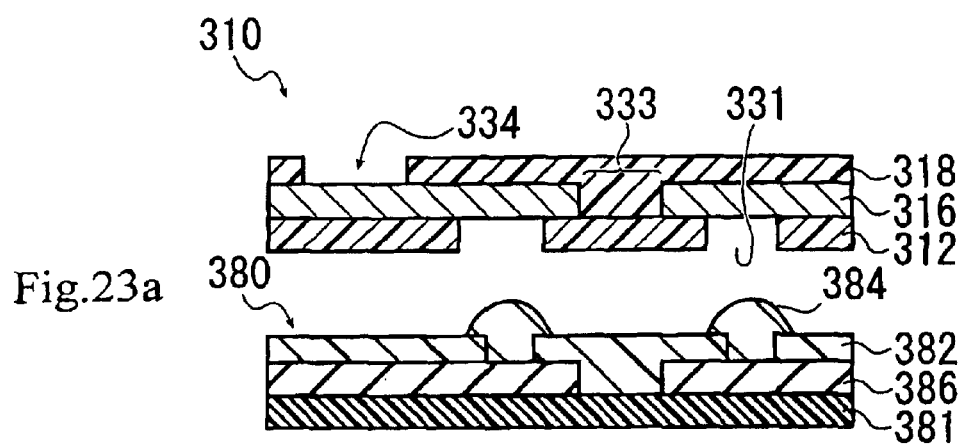
FIGS. 23(a),(b) shows a process for manufacturing a multilayer flexible wiring board.
Figure 23B:
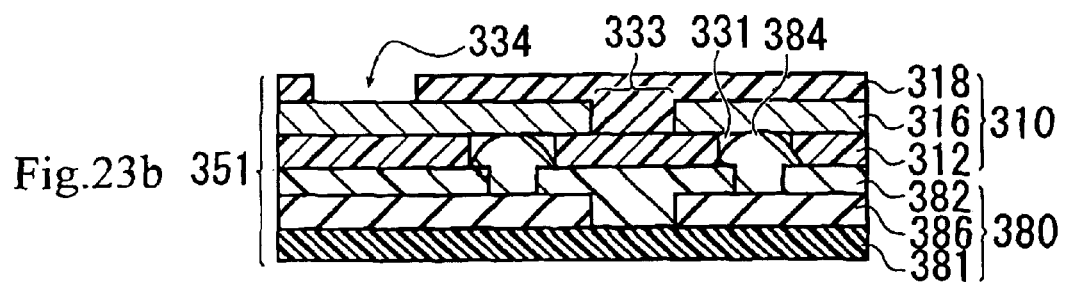

The relationship between the size of projection 165 and the size of opening 108 formed in base film 106 is shown in the following Table 2.

projections 165' as shown in FIG. 19(c) may be provided on pressing face 169 and pressed against base film 106 at vertical angles to apply ultrasonic wave to force into base film 106, thereby forming a rectangular opening 108' as shown in FIG. 19(d).

Figure 12K:
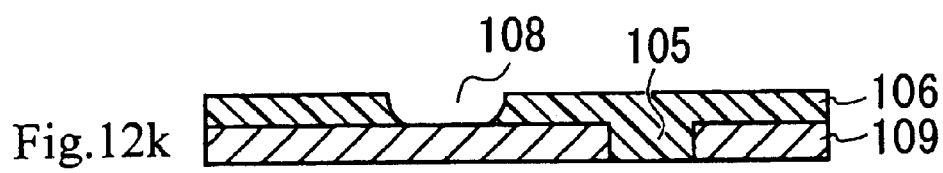
Figure 12L:
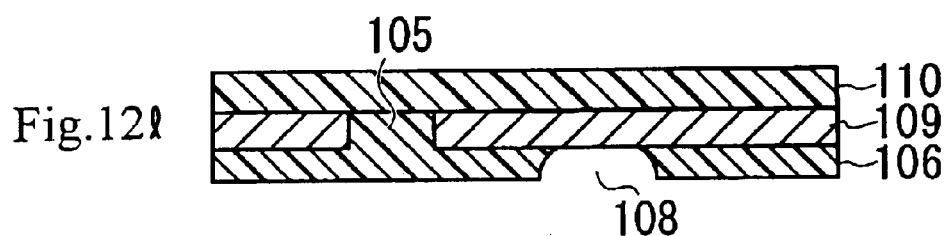

Then, carrier film 102 of single-wiring layer board piece 104 having openings 108 is separated to expose the bottom of first wiring layer 109 (FIG. 12(k)). A polyimide precursor solution is applied on exposed first wiring layer 109 with base film 106 downward and first wiring layer 109 upward (inversion of FIG. 12(k)) followed by imidation by heating to form a cover film 110 including a polyimide film (FIG. 12(l)).

Figure 12M:
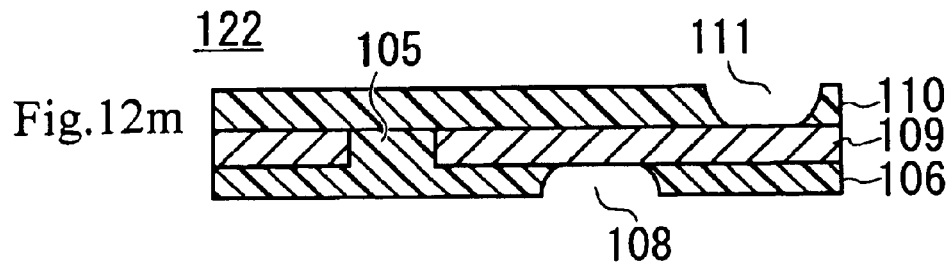

Then, this cover film 110 is forced with ultrasonic manufacturing apparatus 160 described above by the same process as described above to form a plurality of openings, whereby a first single-wiring layer board piece 122 is obtained (FIG. 12(m)). The reference number 111 in FIG. 12(m) represents such an opening. First wiring layer 109 is exposed at the bottom of opening 111.

Next, a process for manufacturing a flexible wiring board of multilayer structure using this first single-wiring layer board piece 122 is explained.

Figure 13A:
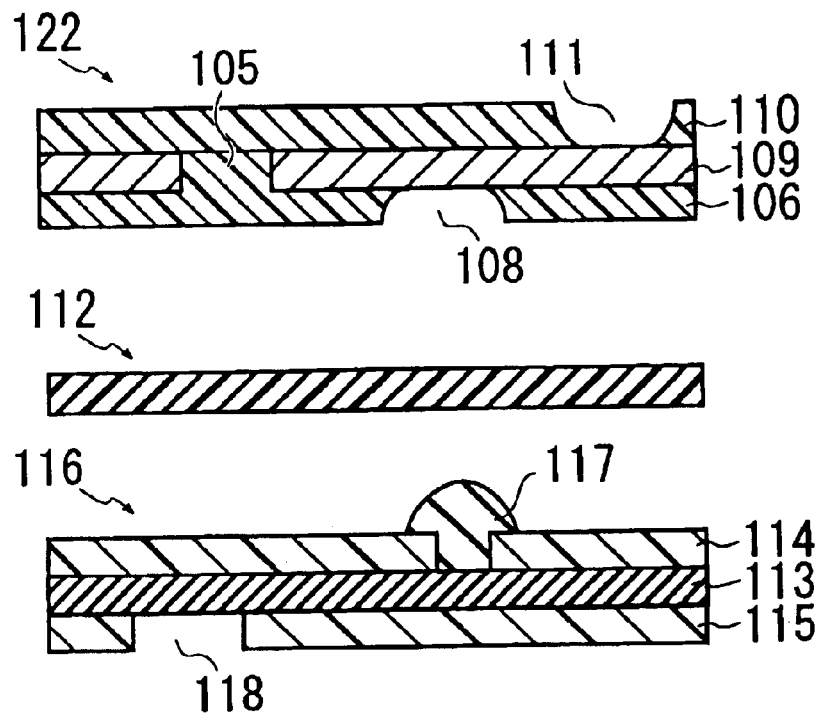
FIGS. 13(a),(b) shows a process for manufacturing a multilayer flexible wiring board according to the present invention.

The reference number 116 in FIG. 13(a) represents a second single-wiring layer board piece comprising a base film 115, a second wiring layer 113 provided on said base film 115, a plurality of bumps 117 upright on said second wiring layer 113, and a cover film 114 applied on the top of second wiring layer 113.

Base film 115 and cover film 114 include a thermosetting polyimide resin. The top of each bump 117 projects from the top of cover film 114.

Base film 115 has a plurality of openings 118 with second wiring layer 113 exposed at the bottom.

Each of a plurality of bumps 117 is located at the position corresponding to opening 108 in said first single-wiring layer board piece 122.

TABLE 2

Relationship between projection diameter and opening size

| Connection means | Ultrasonic wave | Ultrasonic wave | Ultrasonic wave | Ultrasonic wave | Ultrasonic wave | Etching |
|---|---|---|---|---|---|---|
| Thickness of base film (μm) | 10 | 25 | 25 | 25 | 50 | 20 |
| Projection diameter (μm) | 150 | 150 | 100 | 50 | 150 | (Opening in mask) 150 |
| Opening size (μm) | 152 | 155 | 105 | 52 | Not opened | 140 |
| Evaluation result | Pass | Pass | Pass | Pass | Fail | Pass |

(Projection height 40 μm)

The frequency of ultrasonic vibration applied to projection 165 is 40 kHz, and the time for forcing into base film 106 using projection 165 during application of ultrasonic wave is one minute. Opening sizes are shown as maximum lengths.

Table 2 shows that the size of opening 108 increases as the diameter of projection 165 increases.

In the experiments of Table 2 using projection 165 having a height $H_3$ of 40 μm, the result was a fail or any opening 108 was not formed when the thickness $T_3$ of base film 106 exceeds the height $H_3$ of projection 165. This Table 2 also shows the size of an opening formed by conventional etching and the result of a connection test on a multilayer flexible wiring board constructed with such openings and bumps.

Although said projection 165 has a semispherical top to form an elliptic opening 108, a plurality of rectangular Each bump 117 on this second single-wiring layer board piece 116 is opposed to opening 108 in said first single-wiring layer board piece 122 with interposition of adhesive film 112 therebetween to bring each bump 117 into contact with first wiring layer 109 exposed at the bottom of opening 108.

Figure 13B:
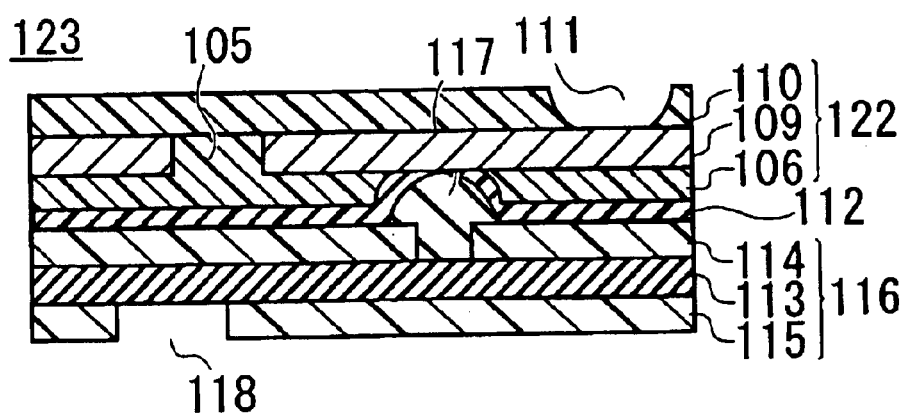

When bump 117 having a solder coat on the surface and adhesive film 112 are heated, bumps 117 and first wiring layer 109 are electrically connected via molten solder coat, and two single-wiring layer board pieces 122, 116 are bonded together via adhesive film 112 developing adhesive force into a multilayer flexible wiring board 123 shown in FIG. 13(b).

An additional single-wiring layer board piece having bumps can be bonded to second wiring layer 113 exposed at the bottom of opening 118 in base film 115 of this multilayer flexible wiring board 123 by bringing said bumps into contact with second wiring layer 113 exposed at the bottom of opening 118 to continuously superpose single-wiring layer board pieces.

Openings 111 formed in cover film 110 of first single-wiring layer board piece 122 can be used for connection with bumps of semiconductor devices or as connection terminals to other electric circuits.

Although openings 108, 111 were formed in base films 106, and cover film 110 on both sides of first wiring layer 109 in first single-wiring layer board piece 122 according to the foregoing embodiment, either one of the base film 106 or cover film 110 of first wiring layer 109 may be opened by ultrasonic vibration to expose the metal film at the bottom according to the present invention.

Although first wiring layer 109 was patterned and then openings 108, 111 were formed in the foregoing embodiment, base film 106 may be opened to expose the metal film at the bottom before the metal film is patterned.

Next, an alternative ultrasonic manufacturing apparatus more suitable for forming an opening is explained.

Figure 17:
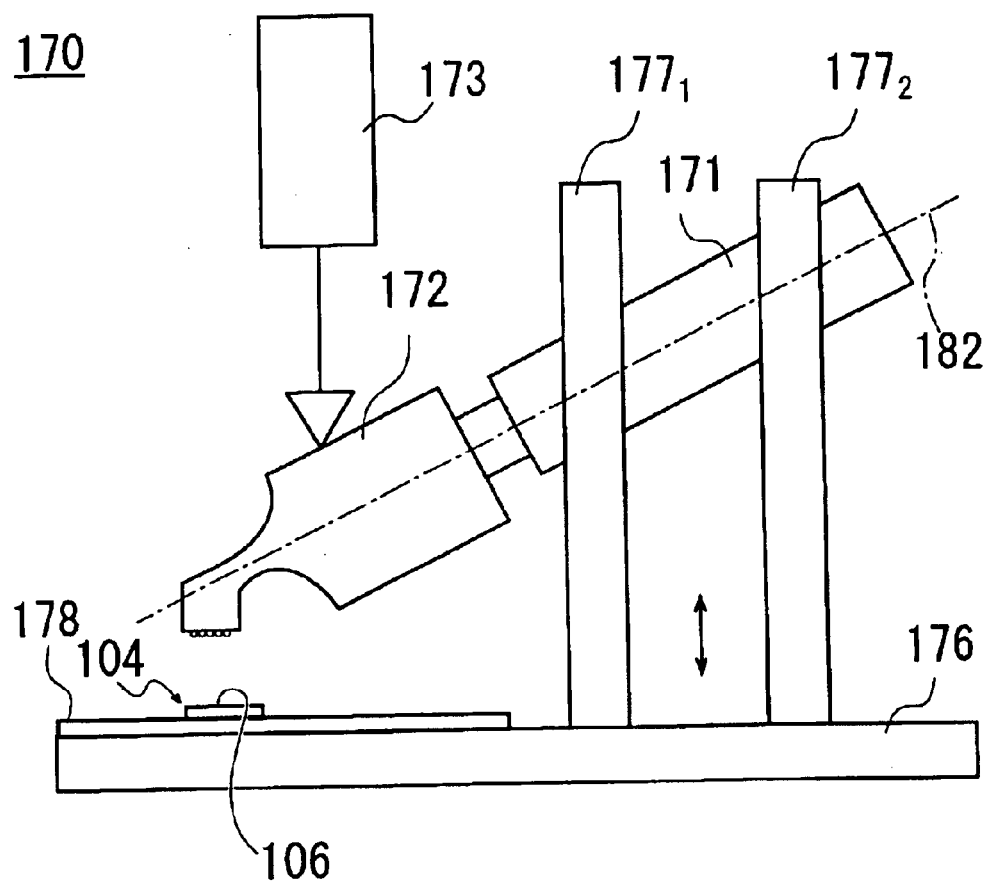
FIG. 17 shows a still alternative ultrasonic manufacturing apparatus according to the present invention.

Referring to FIG. 17, the reference number 170 represents an ultrasonic manufacturing apparatus designed to improve ultrasonic manufacturing apparatus 160 used in the foregoing embodiment.

Similarly to ultrasonic manufacturing apparatus 160 described above, this ultrasonic manufacturing apparatus 170 comprises a cylindrical ultrasonic wave generator 171, a resonator 172 applying ultrasonic vibration to a work, a platform 176 and two guide posts 177₁, 177₂.

Guide posts 177₁, 177₂ in this ultrasonic manufacturing apparatus 170 are also upright on platform 176, but in contrast to ultrasonic manufacturing apparatus 160 described above, ultrasonic wave generator 171 is obliquely fitted to guide posts 177₁, 177₂.

Figure 18:
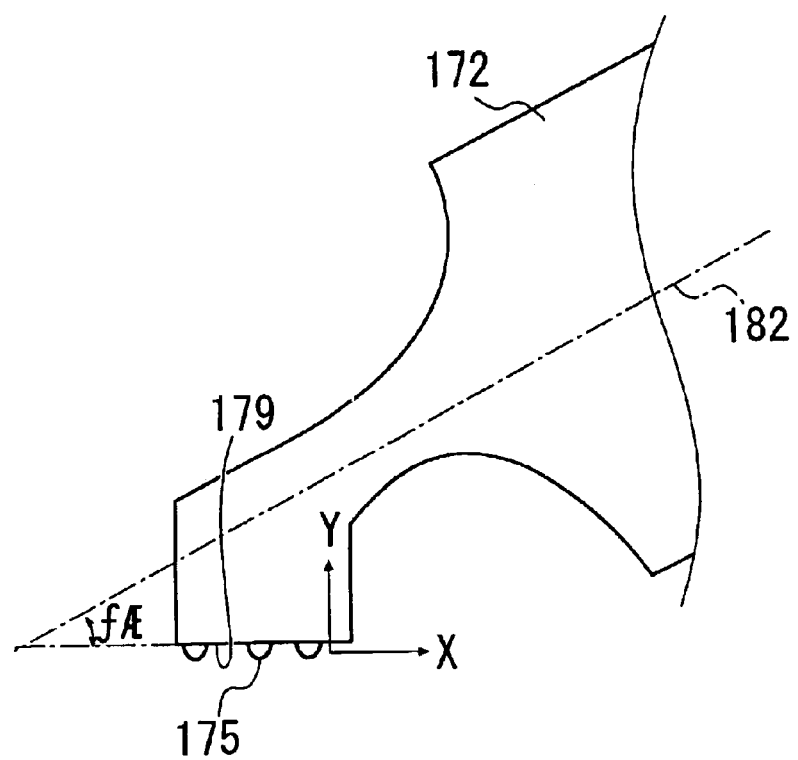
FIG. 18 is an enlarged view of its head portion.

Resonator 172 is fixed to an end of ultrasonic wave generator 171 at one end and has a pressing face 179 at the other end. FIG. 18 shows an enlarged view of resonator 172.

Pressing face 179 is flat but has a plurality of projections 175 vertically upright on the surface.

The head portion of resonator 172 is bent so that pressing face 179 is inclined at an angle from central axis 182 of ultrasonic wave generator 171 and resonator 172. In this FIG. 18, the inclination of pressing face 179 from central axis 182 is expressed as θ.

Thus, the surface 179 of head portion of resonator 172 becomes horizontal if ultrasonic wave generator 171 is fitted to guide posts 177₁, 177₂ with central axis 182 of ultrasonic wave generator 171 being inclined at an angle θ from the horizontal direction. Each projection 175 faces vertically downward when pressing face 179 is horizontal.

After pressing face 179 is thus positioned, a single-wiring layer board piece 104 to be worked is placed on support 178 on platform 176 and ultrasonic wave generator 171 and resonator 172 are allowed to vertically descend by air cylinder 173, whereby the top of projection 175 comes into contact with base film 106 on the top of single-wiring layer board piece 104 at vertical angles, similarly to the foregoing embodiment using ultrasonic manufacturing apparatus 160.

In this ultrasonic manufacturing apparatus 170, ultrasonic vibration generated by ultrasonic wave generator 171 has components parallel and vertical to central axis 182 of ultrasonic wave generator 171 so that projection 175 ultrasonically vibrates only in the horizontal direction when ultrasonic wave generator 171 is inclined and pressing face 179 of resonator 172 is horizontal.

Thus, when projection 175 is ultrasonically vibrated while it is pressed against the top of base film 106, projection 175 forces into base film 106 in the same manner as ultrasonic manufacturing apparatus 160 was used before.

This ultrasonic manufacturing apparatus 170 has high workability, because ultrasonic wave generator 171 and resonator 172 are inclined to prevent resonator 172 from coming into contact with a work.

The area of support 178 may be enlarged to form an opening in a large-area work. Although ultrasonic manufacturing apparatus 160 in the previous embodiment had a workable range of about 20–30 mm, this ultrasonic manufacturing apparatus 170 substantially has no limit. The inclination between resonator 172 and pressing face 179, i.e. the angle of central axis 182 from the horizontal direction should be greater than 0° (horizontal position), but typically between 5° and 60°, desirably 5° and 30°.

The following Table 3 shows ultrasonic vibration components (horizontal and vertical components) applied to projection 175 and the connection results. The reference to "horizontal" in the design of resonator (inclination of 0° from the horizontal direction) corresponds to horizontal ultrasonic manufacturing apparatus 160 described above. Horizontal means the direction of axis X and vertical means the direction of axis Y in FIG. 18.

TABLE 3

Ultrasonic vibration components and connection results

| Inclination of resonator from the horizontal direction (°) | 15 | 10 | 15 | 30 | 0 (Horizontal) | 0 (Horizontal) | 15 |
|---|---|---|---|---|---|---|---|
| Design of resonator | Oblique | Oblique | Oblique | Oblique | Horizontal | Horizontal | Horizontal |
| Frequency of ultrasonic vibration (kHz) | 40 | 40 | 20 | 20 | 40 | 20 | 20 |
| Horizontal amplitude (μm) | 36 | 15 | 18 | 20 | 36 | 18 | 12 |
| Vertical amplitude (μm) | 0 | 0 | 0 | 0 | 0 | 0 | 5 |
| Evaluation of connection result | Pass | Pass | Pass | Pass | Pass | Pass | Fail |

This Table 3 shows that inclusion of vertical vibration components causes connection failure.

Although openings were formed in cured polyimide films using ultrasonic manufacturing apparatus 160, 170 in the foregoing embodiments, the present invention is not limited to polyimide films but also applicable to form an opening in other rein films such as polyester films, epoxy films, etc.

Although resonators 162, 172 and projections 165, 165', 175 were made of iron and projections 165, 165', 175 were formed by discharge-processing the head portions of resonators 162, 172, ultrasonic manufacturing apparatus of the present invention are not limited to these embodiments but also include those made of titanium or other metals.

The height T of each projection 165, 165', 175 may be leveled preferably by polishing after discharge process. Each projection 165, 165', 175 may be coated on the surface to improve durability.

A plurality of projections 165, 165', 175 may be provided or a single one may be provided on the surfaces 169, 179 of end portions.

Top shape of each projection 165, 165' and 175 may be formed semisphere or flat plane. When the shape is formed plane, the plane may form circle or rectangle. When the top shape of projection formed semisphere or plane circle, it is preferable that the diameter is between 100 $\mu$m and 500 $\mu$m. Therefore, the sizes for cross sectional area direction parallel to single-wiring layer board piece of projection 165, 165' and 175 are between $0.79 \times 10^{-8}$ m$^2$ and $19.6 \times 10^{-8}$ m$^2$. When a diameter of bump to be connected is between 250 $\mu$m and 500 $\mu$m, it is also preferable that the diameter of each projection is same as the diameter of bump or more.

As has been described, the present invention does not use any etching solution to form an opening, thus eliminates the need of solution management and simplifies the process to improve productivity. The resulting opening also has high precision.

Multilayer flexible wiring boards can also be constructed without using said adhesive film 112.

Figure 14A:
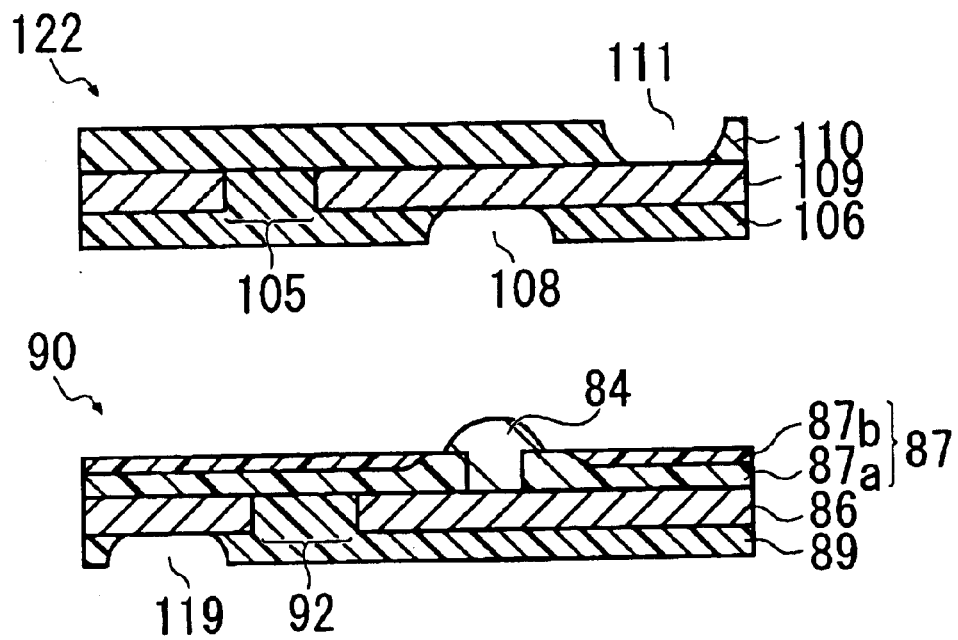
FIGS. 14(a),(b) shows a process for manufacturing an alternative multilayer flexible wiring board according to the present invention.

Referring to FIG. 14(a), second single-wiring layer board piece 90 having cover film 87 developing adhesiveness at the surface upon heating is arranged in parallel with first single-wiring layer board piece 122 having openings 111 formed by ultrasonic manufacturing apparatus 170.

This second single-wiring layer board piece 90 is identical to second single-wiring layer board piece 80 shown in FIG. 4(n) and has a plurality of bumps 84 each provided at the location corresponding to each of a plurality of openings 108 in base film 106 of first single-wiring layer board piece 122.

Figure 14B:
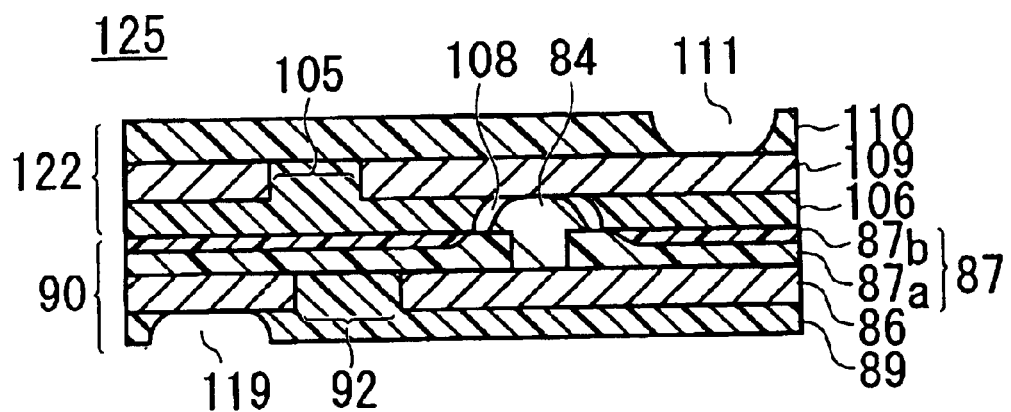

When each bump 84 is brought into contact with first wiring layer 109 exposed at the bottom of opening 108 and heated, cover film 87 of second single-wiring layer board piece 90 develops adhesiveness at the surface so that it is bonded to base film 106 of first single-wiring layer board piece 122 to give a multilayer flexible wiring board 125 as shown in FIG. 14(b).

This second single-wiring layer board piece 90 has openings 119 in base film 89, and second wiring layer 86 is exposed at the bottom of opening 119.

Therefore, bumps of an additional single-wiring layer board piece can be brought into contact with second wiring layer 86 exposed at the bottom of opening 119 to further superpose the additional single-layer wiring board.

As has been described, openings of multilayer flexible wiring boards of the present invention are formed by bringing bumps of a single-wiring layer board piece or projections of an ultrasonic manufacturing apparatus into contact with a resin film and applying ultrasonic wave to them under pressure without patterning the resin film by etching.

The resin film to be ultrasonically opened should suitably consist of a thermosetting resin and preferably be cured by preheating before openings are ultrasonically formed. If a polyimide resin is used, the resin should preferably be coated with a polyimide varnish followed by imidation to form a resin film to be opened.

Imidation may not be completed, but a semicured polyimide film may be ultrasonically opened and then completely cured by reheating.

Alternatively, a polyimide film applied with a resin material and dried may be ultrasonically opened, and then cured.

Ultrasonic manufacturing apparatus of the present invention should have projections in the number corresponding to the number of openings, because they are designed to form one opening by one projection.

If the array pattern of openings in a resin film to be opened is divided in a plurality of patterns and a head portion is provided with projections at the locations corresponding to each pattern, ultrasonic wave can be applied in a plurality of shots to form a plurality of openings on a single resin film.

The top of each projection should preferably be almost centered in an opening to be formed, because the opening becomes larger than the diameter of the projection when it is formed by applying ultrasonic vibration to the projection pressed against a resin film to force into it.

What is claimed is:

1. An ultrasonic manufacturing apparatus comprising an ultrasonic wave generator generating ultrasonic vibration and a resonator transmitting said ultrasonic vibration, wherein said resonator has a plurality of projections capable of simultaneously coming into contact with a flat surface of a work, and wherein each projection has a size expressed as a cross sectional area parallel to said flat surface of said work of $19.6 \times 10^{-8}$ m$^2$ or less at maximum.

2. The ultrasonic manufacturing apparatus according to claim 1 wherein an ultrasonic wave vibrating in a direction parallel to said flat surface of said work is applied to said each projection.

3. The ultrasonic manufacturing apparatus according to claim 1 wherein said ultrasonic wave generator is positioned oblique to said flat surface of said work.

4. The ultrasonic manufacturing apparatus according to claim 1 suitable for forming a plurality of openings in a first single-wiring layer board piece having a first patterned wiring layer and a first resin film in close contact with said first patterned wiring layer, wherein said each projection is provided at the location corresponding to the location of each bump on a second single-wiring layer board piece to be bonded to said first single-wiring layer board piece.

5. The ultrasonic manufacturing apparatus according to claim 4 wherein said resonator is replaceable.

* * * * *